United States Patent
Matsuda et al.

(10) Patent No.: US 7,575,664 B2
(45) Date of Patent: Aug. 18, 2009

(54) PLATING METHOD

(75) Inventors: Tetsuo Matsuda, Tano-gun (JP); Hisashi Kaneko, Fujisawa (JP); Katsuya Okumura, Chiba (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 726 days.

(21) Appl. No.: 11/135,328

(22) Filed: May 24, 2005

(65) Prior Publication Data
US 2005/0211560 A1    Sep. 29, 2005

Related U.S. Application Data

(62) Division of application No. 10/107,425, filed on Mar. 28, 2002, now Pat. No. 6,913,681, which is a division of application No. 09/500,645, filed on Feb. 9, 2000, now Pat. No. 6,375,823.

(51) Int. Cl.
   *C25D 21/12* (2006.01)
(52) U.S. Cl. .................. 205/93; 205/84; 205/98
(58) Field of Classification Search ............. 205/84, 205/93, 98, 117, 123, 137, 157
   See application file for complete search history.

(56) References Cited

U.S. PATENT DOCUMENTS

| | | | | |
|---|---|---|---|---|
| 1,787,431 | A * | 1/1931 | Batenburg et al. | 204/224 R |
| 2,972,882 | A * | 2/1961 | Erwin | 374/7 |
| 3,669,868 | A * | 6/1972 | Lieber et al. | 204/229.7 |
| 3,755,089 | A | 8/1973 | Rapids | |
| 3,954,570 | A * | 5/1976 | Shirk et al. | 205/118 |
| 4,287,043 | A | 9/1981 | Eckert et al. | |
| 4,595,464 | A | 6/1986 | Bacon et al. | |
| 5,324,552 | A * | 6/1994 | Opower et al. | 427/533 |
| 5,571,389 | A * | 11/1996 | Kerampran | 204/224 R |

(Continued)

FOREIGN PATENT DOCUMENTS

JP    54121237 A    9/1979

(Continued)

OTHER PUBLICATIONS

Notification of Reasons for Rejection from Japanese Patent Office mailed Aug. 19, 2008, in Japanese Application No. 1999-033234, and English translation thereof.

(Continued)

*Primary Examiner*—Nam X Nguyen
*Assistant Examiner*—Luan V Van
(74) *Attorney, Agent, or Firm*—Finnegan, Henderson, Farabow, Garrett & Dunner, L.L.P.

(57) ABSTRACT

A cathode potential is applied to a conductive layer formed on a substrate having a depression pattern. A plating solution in electrical contact with an anode is supplied to the conductive layer to form a plating film on the conductive layer. At this time, the plating solution is supplied by causing an impregnated member containing the plating solution to face the conductive layer. Since the plating solution stays in the depression, a larger amount of plating solution is supplied than on the upper surface of the substrate, and the plating rate of the plating film in the depression increases. Consequently, the plating film can be preferentially formed in the depression such as a groove or hole.

7 Claims, 14 Drawing Sheets

U.S. PATENT DOCUMENTS 6,110,345 A * 8/2000 Iacoponi .................. 205/82
6,143,156 A * 11/2000 Zhang .................. 205/93

FOREIGN PATENT DOCUMENTS

| JP | 55-85692 | 6/1980 |
| JP | 2-225691 | 9/1990 |
| JP | 4-154122 | 5/1992 |
| JP | 10-28798 | 11/1998 |
| JP | 10-298798 | 11/1998 |
| JP | 10298798 A * | 11/1998 |
| JP | 11-26394 | 1/1999 |

OTHER PUBLICATIONS

Notification of Reasons for Rejection mailed Mar. 17, 2009, in related Japanese Application No. JP 11-033234.

* cited by examiner

| PLATING METHOD | PLATED THICKNESS [nm/5min] | THICKNESS VARIATION [1σ %] | RESISTIVITY [μΩ·cm] |
|---|---|---|---|
| CUP METHOD | 549 | 16.3 | 2.47 |
| IMPREGNATION (STANDSTILL) | 558 | 10.2 | 2.34 |
| IMPREGNATION (SWING) | 630 | 13.9 | 2.35 |

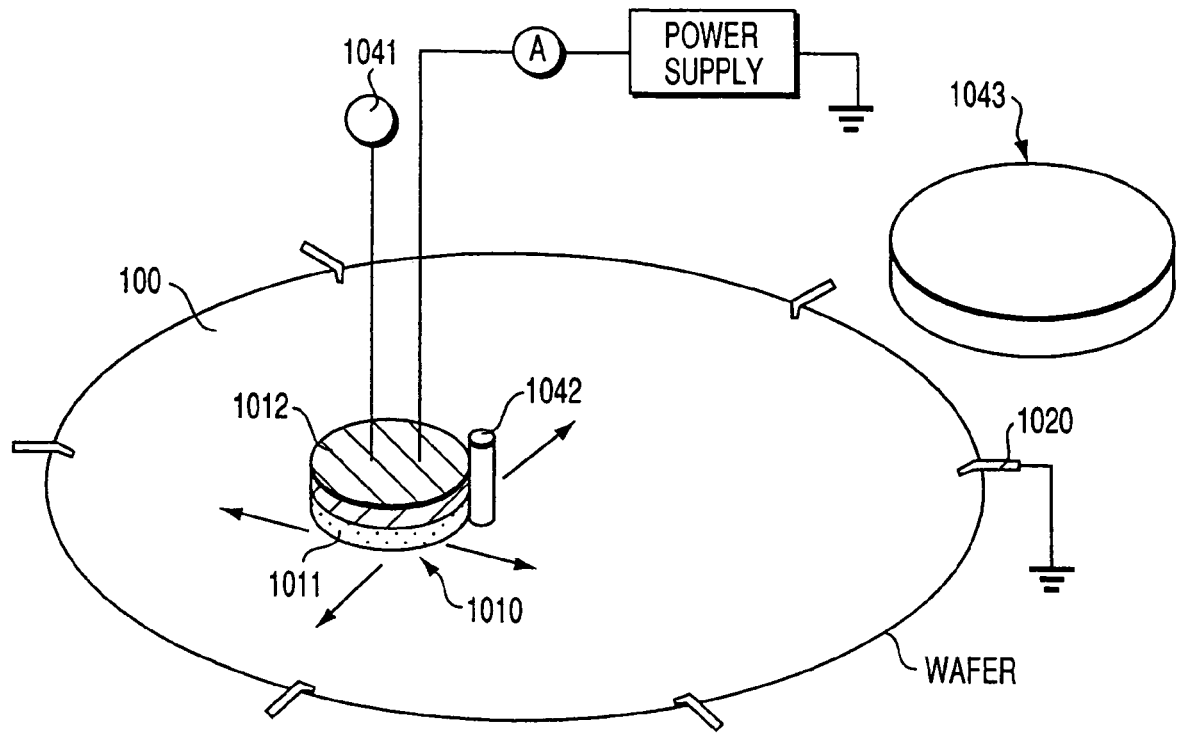
F I G. 16
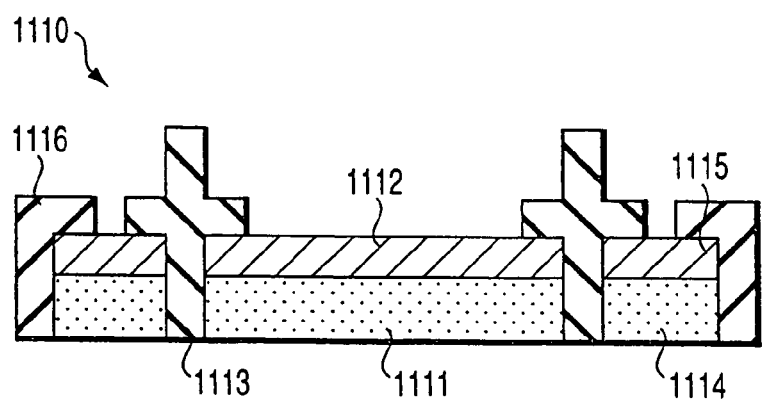
F I G. 17

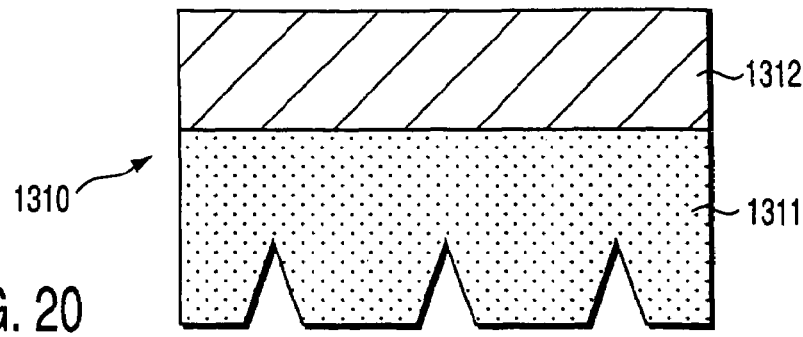
FIG. 20
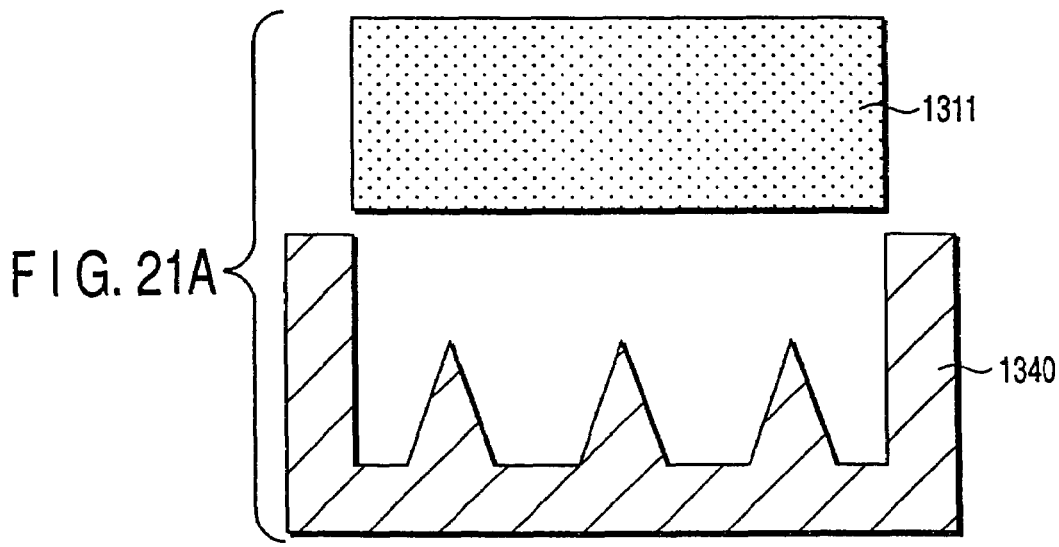
FIG. 21A
FIG. 21B
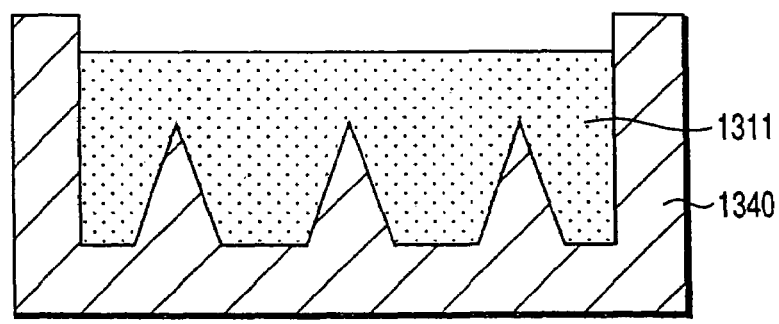
FIG. 21C
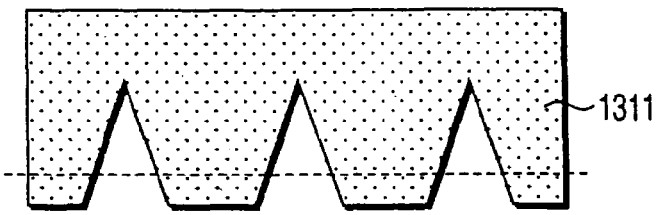
FIG. 21D
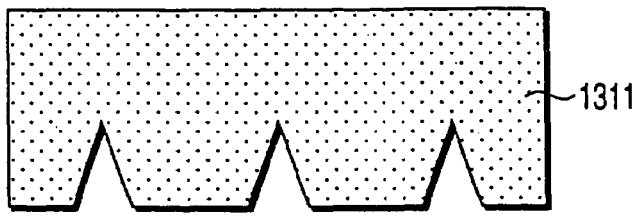

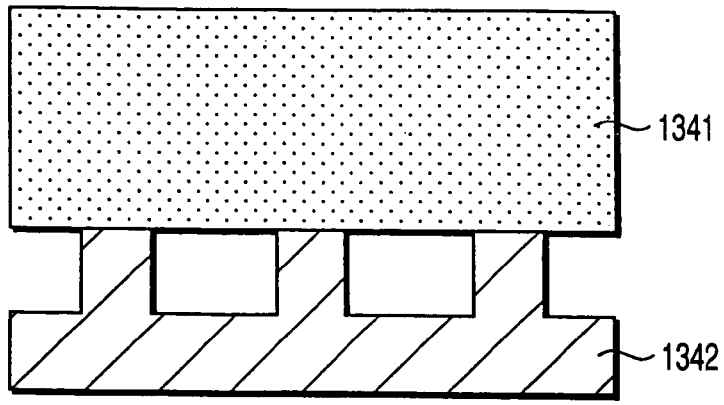
F I G. 22A
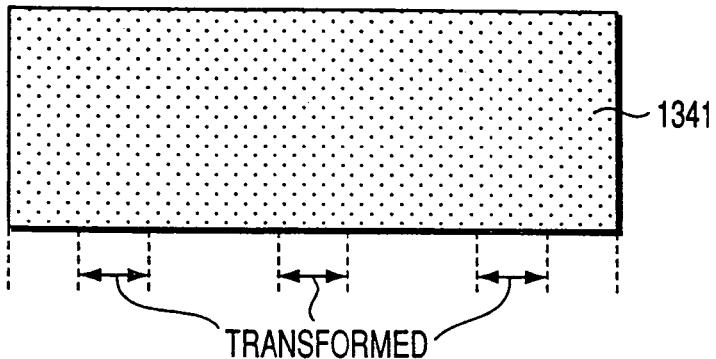
F I G. 22B
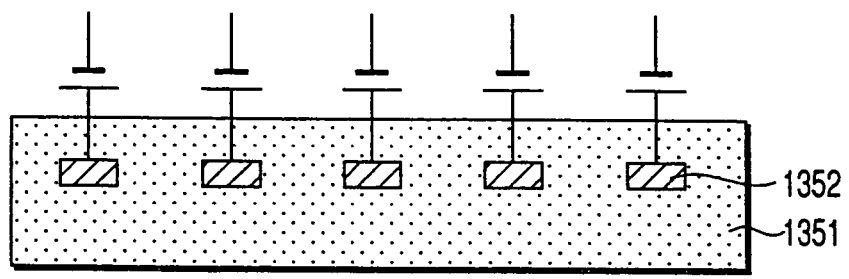
F I G. 23
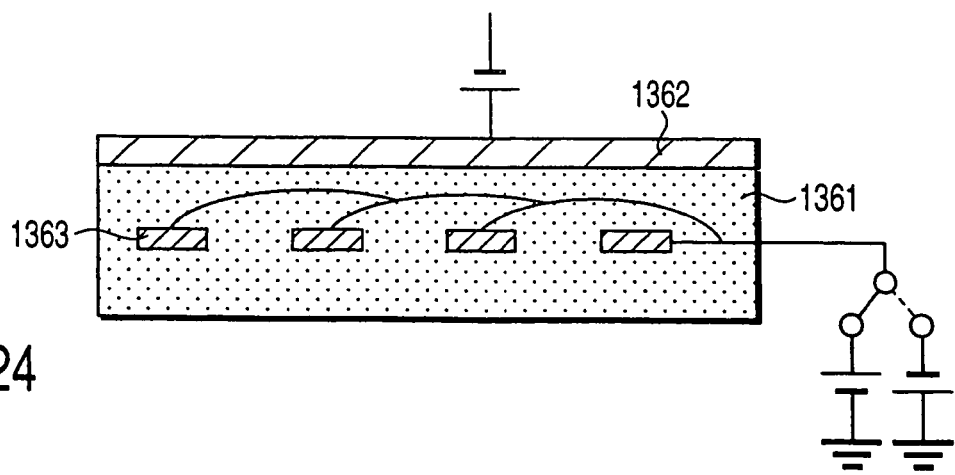
F I G. 24

PLATING METHOD

This is a division of application Ser. No. 10/107,425, filed Mar. 28, 2002 now U.S. Pat. No. 6,913,681, which is a division of application Ser. No. 09/500,645, filed Feb. 9, 2000, now U.S. Pat. No. 6,375,823, both of which are incorporated herein by reference in their entirety.

CROSS-REFERENCE TO RELATED APPLICATION

This application is based upon and claims the benefit of priority from the prior Japanese Patent Application No. 11-033234, filed Feb. 10, 1999, the entire contents of which are incorporated herein by reference.

BACKGROUND OF THE INVENTION

The present invention relates to an electroplating technique and, more particularly, to a plating method and plating apparatus for a semiconductor device.

In recent years, copper has received a great deal of attention as an interconnection material in order to reduce the interconnection resistance of an LSI and improve its reliability. The copper interconnection forming methods include CVD, sputter reflow, and plating. Of these methods, plating is simple in process and low in cost, exhibits high filling performance, and can form a high-performance interconnection.

However, currently available plating apparatuses do not satisfactorily consider a semiconductor device manufacturing process. The conventional apparatus basically adopts a "plating bath" method following the plating industry. According to this method, a semiconductor substrate is plated by dipping it in a plating bath or cup filled with a plating solution.

This classical plating method has not achieved progression particularly considering the semiconductor device manufacturing process. Thus, when the method is applied to the semiconductor device manufacturing process, the following serious problems arise.

(1) It is difficult to perform precise control of an absolute film thickness in nanometers that is much smaller than the film thickness in a general plating industry, and to ensure high uniformity on the substrate surface.

(2) Bubbles and dust greatly influence the semiconductor process to which a very low defect density on a fine pattern is demanded.

(3) A voltage/current from a cathode can only be applied from the periphery of a substrate outside a region where a pattern is formed. If the electrode is brought into contact with the inside of the substrate where the pattern is formed, scratches or dust is generated to decrease the product yield. This is disadvantageous in a situation in which the wafer size in the semiconductor process is increasing year by year. That is, the conductive layer of an electroplating solution must be made thick on the wafer surface. Otherwise, the resistance from the cathode potential supply portion at the periphery of the substrate to the center of the substrate increases, failing to ensure the plating current at the center. However, the thickness of the conductive layer is limited by process constraints.

(4) It is difficult to perform locally plating in accordance with a regular pattern formed on a semiconductor substrate. It is also difficult to perform positive control of the film thickness on the surface of a semiconductor substrate (wafer), for example, to make the periphery thick in accordance with requirements in a post-plating step (e.g., CMP). If the plating solution is not wanted to attach to the lower surface of the substrate in order to prevent contamination of the substrate or the like, a special seal must be used to protect the lower surface.

(5) In forming a film into a three-dimensional pattern, film formation on projections cannot be suppressed. An example of the most typical applications of a plating metal film among semiconductor processes is formation of a metal film for forming a damascene interconnection. In the damascene process, a plating metal is buried in an interconnection groove or hole, and a metal film formed outside the groove or hole is removed by CMP or the like. Considering load reduction in a subsequent CMP step or the like, formation of the plating film on a portion except for the groove or hole must be prevented as much as possible. The above-described requirements and problems unique to the semiconductor process obstruct the use of plating.

BRIEF SUMMARY OF THE INVENTION

It is an object of the present invention to provide a plating method and plating apparatus which can easily perform precise control of the plating film thickness and are hardly influenced by bubbles and dust.

It is another object of the present invention to provide a plating method which realizes preferential formation of a plating film to a groove or hole suitable for the damascene process.

It is still another object of the present invention to provide a plating method and plating apparatus capable of performing local plating.

To achieve the above objects, according to the first aspect of the present invention, there is provided a plating method comprising the steps of preparing a substrate to be processed which has a base plate and a conductive layer formed on at least part of the base plate, applying a potential of a cathode to the conductive layer, causing a first impregnated member containing a plating solution in electrical contact with an anode to face the conductive layer, and relatively moving at least part of the first impregnated member with respect to the conductive layer in order to form a plating film on at least part of the conductive layer.

The step of relatively moving at least part of the first impregnated member with respect to the conductive layer desirably includes the step of vertically moving the at least part of the first impregnated member with respect to the conductive layer.

The step of vertically moving at least part of the first impregnated member with respect to the conductive layer desirably includes the step of moving the anode in contact with the first impregnated member apart from the conductive layer in accordance with plating of the plating film.

The step of vertically moving at least part of the first impregnated member with respect to the conductive layer may include the step of controlling at least one of a moving speed of relative movement in a vertical direction and an application current in accordance with plating of the plating film.

The step of vertically moving at least part of the first impregnated member with respect to the conductive layer desirably includes the step of forming a plating film while alternately repeating an operation of causing the conductive layer and the first impregnated member to face each other and an operation of dipping the first impregnated member into a plating bath containing the plating solution.

The step of connecting the cathode to the conductive layer desirably includes the step of connecting the cathode to the conductive layer by bringing a second impregnated member which contains an electrolytic solution and is connected to the cathode into facing the conductive layer in a different region from a region where the first impregnated member comes into facing the conductive layer.

The second impregnated member can perform the same relative movement as the first impregnated member.

The plating method desirably further includes the step of measuring a film thickness of the plating film by a film thickness measuring mechanism arranged on the conductive layer in a different region from a region where the first impregnated member comes into facing the conductive layer.

The plating method desirably further includes the step of additionally forming the plating film by bringing the impregnated member into facing the conductive layer in accordance with a measurement result of the film thickness measuring mechanism.

The film thickness measuring mechanism desirably performs the same vertical movement as the first impregnated member.

The step of vertically moving at least part of the first impregnated member with respect to the conductive layer can include the step of bringing at least part of the first impregnated member into contact with the conductive layer.

The step of relatively moving at least part of the first impregnated member with respect to the conductive layer can include the step of horizontally moving at least part of the first impregnated member with respect to the conductive layer.

The step of horizontally moving at least part of the first impregnated member with respect to the conductive layer desirably includes the step of bringing at least part of the first impregnated member into contact with the conductive member, and moving the plating solution on an upper surface of the base plate into the depression pattern formed in advance in the upper surface of the base plate by sliding movement.

According to the second aspect of the present invention, there is provided a plating method comprising the steps of preparing a substrate to be processed which has a base plate and a conductive layer formed on at least part of the base plate, applying a potential of a cathode to the conductive layer, causing a first impregnated member containing a plating solution in electrical contact with an anode to face the conductive layer, and forming a plating film on at least part of the conductive layer while controlling a film thickness profile.

The step of forming a plating film on at least part of the conductive layer while controlling a film thickness profile desirably includes the following steps:

1) the step of making a film thickness on a depression pattern of the base plate larger than a film thickness on an upper surface of the base plate, the base plate having the depression pattern on a surface thereof;

2) the step of controlling at least one of a stay time of the impregnated member on the conductive layer and an application current value supplied between the anode and the cathode;

3) the step of setting the anode having a desired pattern on the impregnated member;

4) the step of controlling a flat distribution of a current flowing through the conductive layer by either one of an electrode and an insulator with a desired pattern formed inside the impregnated member;

5) the step of using the impregnated member having a desired two dimensional distribution of a supply amount of plating solution to the conductive layer.

6) the step of relatively moving the impregnated member and an upper surface of the base plate in a facing plane direction, thereby decreasing the plating solution on the upper surface of the base plate, the base plate having a depression pattern on the surface; and 7) the step of bringing part of the impregnated member into contact with the conductive layer and controlling a film thickness in accordance with whether the impregnated member is in contact with the conductive layer.

According to the third aspect of the present invention, there is provided a plating method comprising the steps of preparing a substrate to be processed which has a base plate and a conductive layer formed on at least part of the base plate, applying a potential of a cathode to the conductive layer, and forming a plating film on at least part of a region by causing an impregnated member containing a plating solution in electrical contact with an anode to face the conductive layer, wherein the step of forming a plate film includes the step of forming a plating film while alternately repeating an operation of causing the conductive layer and the impregnated member to face each other and an operation of moving the impregnated member to a remote location where a plating current is interrupted between the anode and the cathode.

The operation of moving the impregnated member to a remote location desirably includes an operation of dipping the impregnated member into a plating bath containing the plating solution.

According to the fourth aspect of the present invention, there is provided a plating method comprising the steps of preparing a substrate to be processed which has a base plate and a conductive layer formed on at least part of the base plate, causing an impregnated member containing a plating solution in electrical contact with an anode to face the conductive layer in order to form a plating film in at least part of a region, and connecting a cathode to the conductive layer by causing another impregnated member which contains an electrolytic solution and is connected to the cathode, to face the conductive layer in a different region from a region where the impregnated member comes into contact with the conductive layer.

The conductive layer may be in contact with at least one of the impregnated member and the another impregnated member.

The another impregnated member can perform the same sliding movement as the impregnated member.

According to the fifth aspect of the present invention, there is provided a plating method comprising the steps of preparing a substrate to be processed which has a base plate and a conductive layer formed on at least part of the base plate, causing an impregnated member containing a plating solution in electrical contact with an anode to face the conductive layer in order to form a plating film in at least part of the conductive layer, connecting a cathode to the conductive layer by causing another impregnated member which contains an electrolytic solution and is connected to the cathode, to face the conductive layer in another region than a region where the impregnated member faces the conductive layer, and measuring a film thickness of the plating film by a film thickness measuring mechanism arranged on the conductive layer in still another region than a region where the impregnated member faces the conductive layer.

The plating method desirably further includes the step of additionally forming the plating film by causing the impregnated member to face the conductive layer in accordance with a measurement result of the film thickness measuring mechanism.

The film thickness measuring mechanism desirably performs the same horizontal movement as the impregnated member.

According to the sixth aspect of the present invention, there is provided a plating apparatus for forming a plating film on a conductive layer formed on at least part of a surface of a substrate, comprising a power supply for supplying an anode potential and a cathode potential, the cathode potential being applied to the conductive layer, an anode for receiving the anode potential, a first impregnated member which has a first and a second major surface, is in contact with or faces at least a partial region of the conductive layer on the first major surface, is in contact with the anode on the second major surface, holds a plating solution, and supplies the plating solution to the conductive layer, a plating solution supply mechanism for supplying the plating solution to the first impregnated member, and a first controller for controlling formation conditions of the plating film.

The plating apparatus desirably further includes the following arrangements.

1) The plating apparatus further comprises a second controller for controlling a gap between the substrate and the first impregnated member facing the substrate in accordance with plating of the plating film.

2) The plating apparatus further comprises an insulating member formed to surround a side portion of the first impregnated member and a side portion of the anode in contact with the second major surface of the first impregnated member, and a second impregnated member which is adjacent to the first impregnated member through the insulating member, holds an electrolytic solution, supplies the electrolytic solution to the conductive layer, and receives the cathode potential.

3) The plating apparatus further comprises an insulating member formed along a side surface of an opening formed through the first impregnated member and the anode in contact with the second major surface of the first impregnated member, and a second impregnated member which is formed in the opening through the insulating member, holds an electrolytic solution, supplies the electrolytic solution to the conductive layer, and receives the cathode potential.

4) The plating apparatus further comprises a first moving mechanism for changing relative positions of the conductive layer and the first impregnated member in a contact or facing plane direction.

5) The anode has at least one through hole, and the plating solution supply mechanism supplies the plating solution to the first impregnated member through at least one through hole formed in the anode.

6) The plating solution supply mechanism comprises a plating bath filled with the plating solution, and a second moving mechanism for moving the first impregnated member in contact with or facing at least the partial region of the conductive layer, and dipping the first impregnated member in the plating bath.

7) The plating apparatus further comprises a sensor for sensing a gap between the anode and the conductive layer, and a third controller for adjusting the gap between the anode and the conductive layer in accordance with a detection result.

8) The plating apparatus further comprises a composition sensor for sensing a composition ratio of the plating solution contained in the impregnated member, and a composition adjusting unit for adjusting a composition of the plating solution for the impregnated member in accordance with a sensing result of the composition sensor.

9) The plating apparatus further comprises a fourth controller for controlling at least one of a stay time during which the impregnated member stays on at least part of the conductive layer, and an application current value between the anode and the conductive layer.

10) The anode is formed with a desired pattern.

11) The plating apparatus further comprises either one of an electrode and an insulator with a desired pattern formed inside the first impregnated member.

12) The first impregnated member has a desired distribution as a supply amount distribution of the plating solution to the conductive layer.

13) The plating apparatus further comprises a fifth controller for slightly vibrating the first impregnated member up and down, and right and left upon energization.

14) The plating apparatus further comprises at least one strainer arranged inside the first impregnated member, near a facing portion between the first impregnated member and the conductive layer, in order to drain the plating solution.

With these arrangements, the present invention attains the following operation effects.

According to the plating method of the present invention, an impregnated member containing a plating solution is placed on a substrate to be processed. An anode is set on the impregnated member, whereas a cathode is connected to the substrate. Unlike the plating bath method, the plating method of the present invention can control the plating rate of a plating film to be formed, by controlling the stay time of the impregnated member on a member to be plated, the application current value, the pattern of the anode, the pattern of an intermediate electrode or insulator formed in the impregnated member, or the supply distribution of the plating solution to the impregnated member. This facilitates control of the plated thickness.

A through hole is formed in the anode, and bubbles in the plating solution held by the impregnated member can be removed to suppress defects of the plating film caused by the bubbles. Further, the impregnated member and substrate are relatively moved in the direction of the contact plane. This prevents bubbles or dust in the plating solution supplied to the substrate surface from staying at one portion. Defects of the plating film are therefore suppressed.

If plating using the impregnated member is done for a conductive layer formed on a substrate surface having a depression pattern of grooves or holes, the plating solution stays in the depression, and the supply amount of plating solution to the depression becomes larger than on the upper surface of the substrate. Hence, the plating rate of the plating film on the surface of the depression becomes higher than on the upper surface of the substrate. Preferential formation of the plating film in the groove or hole can be realized to form a plating film suitable for the damascene process. By relatively moving the impregnated member and substrate in the direction of the contact plane, the surface of the plating film formed on the upper surface of the substrate is mechanically polished by the impregnated member. More preferential formation of the plating film in the groove or hole can be achieved.

Even if the impregnated member is not in contact with the substrate to be processed, a dynamic pressure is generated in the plating solution due to relative movement. A pressure difference between an inside and an outside of the depression caused by the dynamic pressure can make the plating rate greater in a groove or a hole than that on the upper surface of the substrate.

The depression in the surface of the plating film formed finally is shallower and smoother than the depression in the substrate, which facilitates a subsequent smoothening step using chemical mechanical polishing.

The plating solution can be selectively supplied to the substrate surface using an impregnated member smaller in size than the substrate. Consequently, a plating film can be locally formed. Since the plating film is formed at only a portion on the substrate where the anode exists, the plating film can be locally formed even using an anode of a desired pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are views showing a structure for forming a characteristic estimation plating film by impregnation, in which FIG. 5A is a plan view and FIG. 5B is a sectional view taken along the line 5B-5B in FIG. 5A;

FIGS. 11A and 11B are views showing the schematic structure of a plating apparatus according to the third embodiment of the present invention, in which FIG. 11A is a perspective view and FIG. 11B is an enlarged sectional view taken at the portion 11B in FIG. 11A;

FIGS. 15A to 15C are a view and graphs, respectively, showing the positional dependency of a plating film formed at a constant voltage on a substrate to be processed, in which FIG. 15A is a view for defining the direction, FIG. 15B is a graph showing positional dependency in a direction indicated by a solid line in FIG. 15A, and FIG. 15C is a graph showing positional dependency in a direction indicated by a dotted line in FIG. 15A;

FIG. 16 is a view showing the schematic structure of a plating apparatus according to the fourth embodiment of the present invention;

FIG. 17 is a sectional view showing the schematic structure of the main part of a plating apparatus according to the fifth embodiment of the present invention;

FIG. 20 is a sectional view showing the schematic structure of a plating apparatus (impregnated pad) according to the seventh embodiment of the present invention;

FIGS. 21A to 21D are sectional views, respectively, showing steps in manufacturing an impregnated pad according to the seventh embodiment;

FIGS. 22A and 22B are sectional views, respectively, showing steps in manufacturing an impregnated pad according to a modification of the seventh embodiment;

FIG. 23 is a sectional view showing the schematic structure of an impregnated pad according to another modification of the seventh embodiment;

FIG. 24 is a sectional view showing the schematic structure of an impregnated pad according to still another modification of the seventh embodiment;

DETAILED DESCRIPTION OF THE INVENTION

"Impregnation" in the present invention means a state in which a plating solution is held by an impregnated member such as a solid, mixture of a solid and liquid, or mixture prepared by mixing a gas in a mixture of a solid and liquid. The plating solution is limited to a certain degree in spatial movement, compared to the case in which the plating solution is solely contained in a vessel. The impregnated member comes into contact with a substrate to be processed, and then the plating solution acts on the substrate. In some cases, part of the impregnated member may not contact the substrate. Even in this case, however, the plating solution may be supplied to the substrate (by, e.g., a surface tension) near the facing portion between the impregnated member and substrate. This state may be accepted depending on the purpose of a technique to be implemented, or can be avoided if the state is disadvantageous for the purpose of a technique to be implemented.

Standard conditions of copper plating used in the following embodiments are as follows:

Temperature: 25° C.

Current Density: 5 mA/cm$^2$

Plating Rate: up to 100 nm/min

Anode Material: Phosphorous Containing Copper

Wafer: A 30-nm thick Ta film and 100-nm thick Cu film are sequentially sputtered on an Si substrate.

These process conditions are merely standard ones for convenience in describing the embodiments of the present invention. The plating metal and respective parameters can be properly changed without departing from the spirit and scope of the present invention.

Embodiments of the present invention will be described below with reference to the accompanying drawings.

First Embodiment

Figure 1:
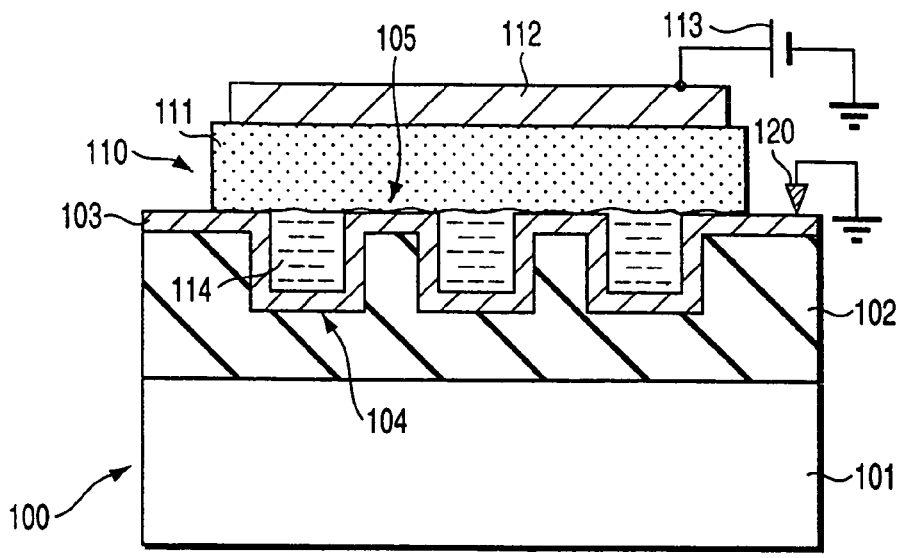
FIG. 1 is a sectional view showing a schematic structure around a plating head to explain a plating method according to the first embodiment of the present invention.

In the first embodiment, the principle of a plating method according to the present invention will be explained. FIG. 1 is a sectional view showing the schematic structure of a plating apparatus according to the first embodiment of the present invention. A substrate 100 to be plated has a base plate on which an insulating film 102 with a groove pattern is formed on an Si substrate (semiconductor substrate) 101, and a conductive layer 103 formed on the surface of the insulating film 102. The conductive layer 103 is a multilayered film made of a 30-nm thick TaN film and 100-nm thick Cu film. The Si substrate 101 is an 8-inch wafer. Eight needle-like cathode contacts 120 are uniformly set at the outermost periphery of the conductive layer 103 formed on the surface of the Si substrate 101.

A plating head 110 is placed on the surface of the conductive layer 103. The plating head 110 is constituted by an impregnated pad (impregnated member) 111 which is directly placed on the conductive layer 103 and contains a plating solution, and an anode 112 which is made of phosphorous containing copper, set on the impregnated pad 111, and connected to a power supply 113. The impregnated pad 111 is formed from PVA (Polyvinyl Alcohol). The diameter of the impregnated pad 111 may be larger or smaller than or equal to that of the substrate 100.

In addition to PVA, the impregnated pad 111 may be made of a porous ceramic, indefinite material such as a silica gel or agar, or material prepared by knitting porous Teflon, polypropylene, or the like into a fiber or forming such material into a sheet. The porosity or pore size is not uniquely determined, and changes depending on the viscosity of a liquid, the wettability and surface tension between the impregnated member and liquid, and the like. The impregnated pad basically suffices to achieve a state in which the pad can hold a liquid to limit the liquid in spatial movement (for example, most of the liquid is prevented from flowing out without any catch tray).

An actual plating process will be explained. The pad 111 is dipped in a plating solution at 25° C. filled in a plating bath (not shown) to impregnate the pad 111 with the plating solution. The composition of the plating solution is copper sulfate pentahydrate ($CuSO_4 \cdot 5H_2O$):250 g/Liter, sulfuric acid ($H_2SO_4$):180 g/Liter, hydrochloric acid (HCl):60 mg/Liter. Additives such as a polymer and complex compound are added for various purposes such as the pH of the plating solution, stabilization of the plating solution, protection of the anode, surface smoothness of a formed film, and control of the crystal grain of the formed film.

By bringing the impregnated pad 111 into tight contact with the conductive layer 103, the plating solution is supplied from the impregnated pad 111 to the surface of the conductive layer 103. Then, a current having a current density of 5 mA/cm$^2$ is supplied from the power supply 113 to the anode 112. When the current is supplied to the anode 112, a copper plating thin film is formed on the surface of the conductive layer 103 electrically connected to the cathode contacts 120. Note that the average plating rate of the copper plating thin film was about 100 nm/min.

Figure 2:
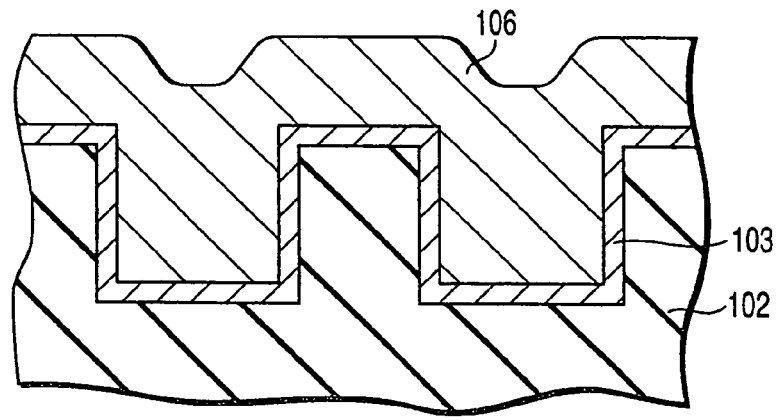
FIG. 2 is a sectional view showing a plating film having a smooth profile that is formed by the plating method of the present invention.

As shown in FIG. 1, a plating solution 114 oozing out from the impregnated pad 111 stays in depressions 104. For this reason, the plating supply amount to the depressions 104 is larger than on an upper surface 105 of the substrate 100. Since the supply amount of plating solution having a degree of freedom for spatial movement is large, the plating rate of the plating film on the conductive layer 103 in each depression 104 is higher than on the conductive layer 103 on the upper surface 105. Thus, as shown in FIG. 2, a plating film 106 to be finally formed has smoother steps than the stepped pattern of an insulating film. Generation of dishing can therefore be suppressed to facilitate smoothening in a subsequent planarization step using CMP (Chemical Mechanical Polishing) or the like.

Figure 3A:
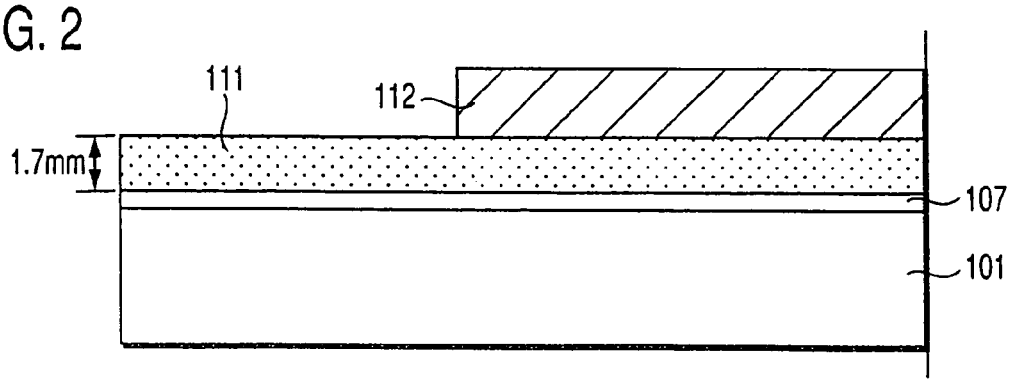
FIG. 3A is a sectional view around a plated portion showing the positional relationship between an impregnated member and anode.

A sample like the one shown in FIG. 3A was fabricated and plated with copper. The sample had the following structure. An impregnated pad 111 containing a plating solution was placed on a Cu film 107 on an Si substrate 101, and an anode 112 having an edge at a position apart from the edge of the Si substrate 101 was set on the impregnated pad 111.

Figure 3B:
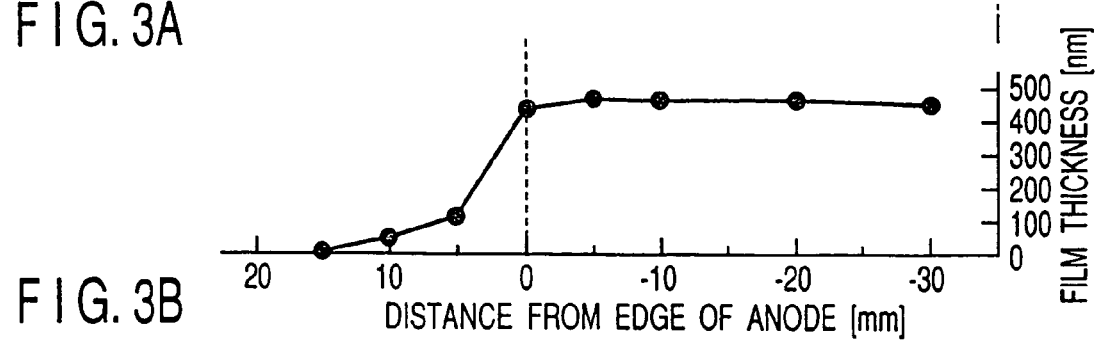
FIG. 3B is a graph showing the relationship between the film thickness of a plating film formed by the structure of FIG. 3A and the distance from the edge of the anode.

As shown in FIG. 3B, the film thickness distribution of the formed copper plating film reveals that the film thickness decreases at a position farther away from the edge of the anode 112. By forming the anode into a desired pattern, the plating film can be selectively formed in accordance with the anode pattern.

Figure 4:
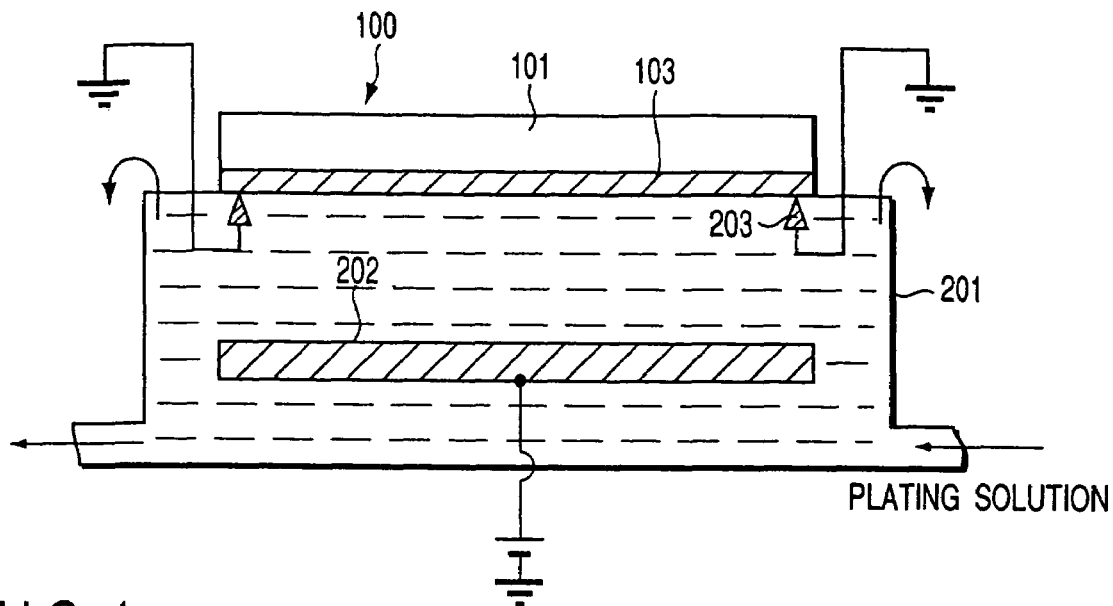
FIG. 4 is a schematic view showing a conventional cup type plating apparatus.

In comparison, a copper plating thin film was formed by a plating apparatus of a conventional plating bath method (so-called cup method) as shown in FIG. 4. In this apparatus, an anode 202 made of phosphorous containing copper was set in a plating bath 201 to which a plating solution was continuously supplied to overflow. A substrate 100 to be processed with a conductive layer 103 facing down as a surface to be plated was held at a plurality of hook-like cathode contacts 203, and the conductive layer 103 and cathode contacts 203 were electrically connected. By moving down the substrate 100, the conductive layer 103 was brought into contact with the plating solution to form a copper plating film on the surface of the conductive layer 103.

The copper plating thin film formed by impregnation had the same film thickness (1 µm for 10 min) and resistivity (1.95 µΩ/cm) as those of the copper plating film formed by the conventional cup method. No film was formed at a portion where the substrate and impregnated pad did not contact each other, and the periphery, bevel, and lower surface of the substrate were not contaminated.

Figure 5A:
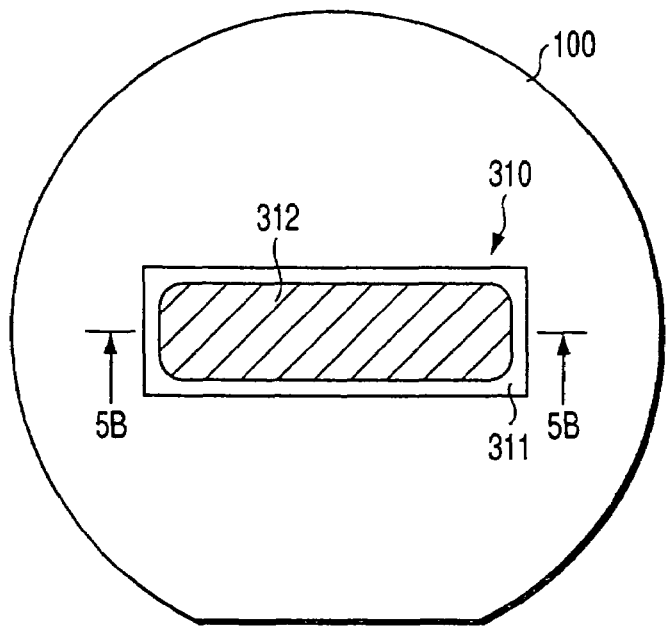
Figure 5B:
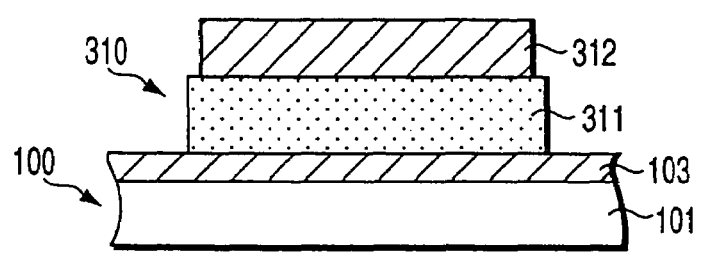

The impregnation method and cup method, and the results of comparison between the copper plating films formed by the respective methods will be explained. Impregnation was done for a sample having a structure as shown in FIGS. 5A and 5B. FIG. 5A is a plan view showing the schematic structures of the apparatus and substrate to be processed, and FIG. 5B is a sectional view taken along the line 5B-5B in FIG. 5A. A plating head 310 is placed on a substrate 100 to be processed. The plating head 310 is comprised of an impregnated pad 311 containing a plating solution that is directly mounted on the substrate, and an anode set on the impregnated pad.

Figures 6, 8:
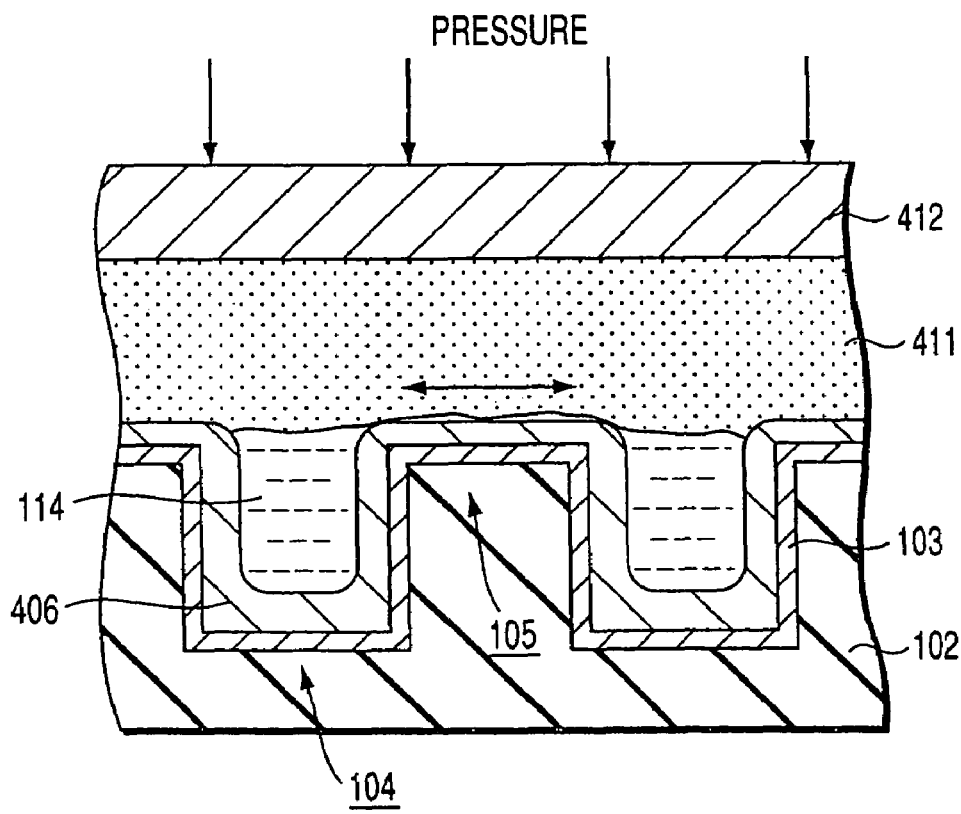
FIG. 6 is a graph showing the comparison between the characteristics of plating films respectively formed by a conventional plating method (cup method) and the impregnation method of the present invention.
FIG. 8 is a sectional view around a plated portion schematically showing the contact surface between an impregnated pad and a plating film formed in the second embodiment.

The current density was 5 mA/cm$^2$, the plating time was 5 min, the plating solution was a mixture of hydrochloric acid in a CuSO$_4$-based solution, and the Cu content was 0.9 mol/Liter. In impregnation, two cases were compared: the plating head 310 was kept at a standstill with a gap being adjusted to 1.7 mm between the anode 312 and a conductive layer 103, and the plating head 310 swung or scrolled. The film thicknesses, variations, and resistivities of the respective copper plating films are shown in FIG. 6.

The film thickness of a copper plating film is higher in the swing method than in the remaining methods. This is because a portion made thin at the outermost periphery of the copper plating film was not measured, and the average of the thicknesses of the entire film is considered to be equal to those in the remaining methods.

Thickness variations of a plating film formed by the impregnation method were reduced in comparison with a plating film formed by the cup method. In particular, thickness variations of a film formed by keeping the head at a standstill were reduced by about 60%. The resistivity of a plating film formed by the impregnation method was also lower than that by the cup method.

Second Embodiment

Figure 7A:
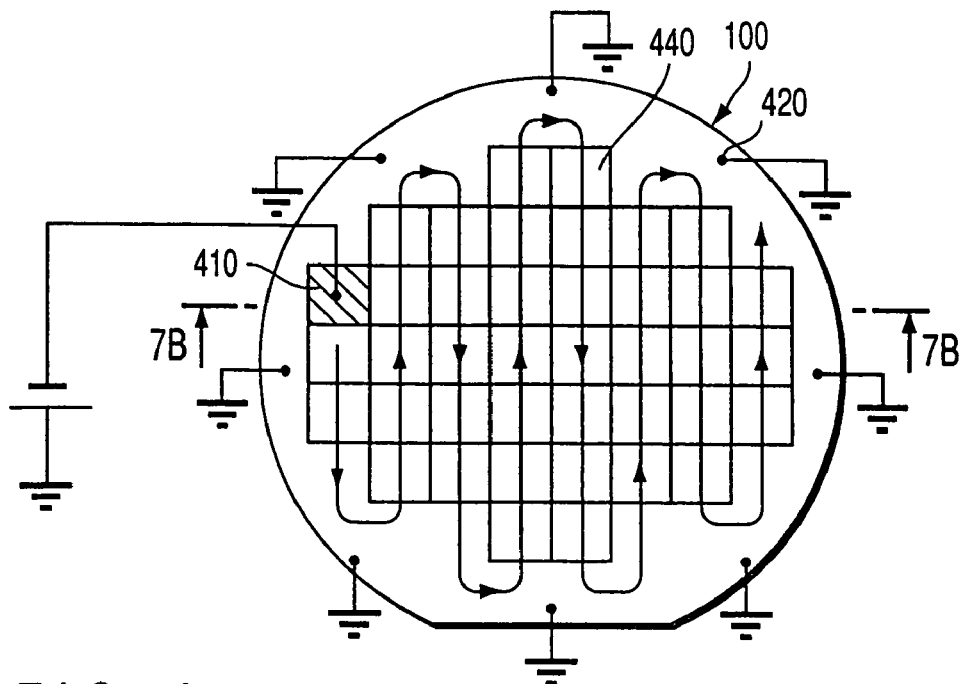
FIG. 7A is a schematic view for explaining a plating method according to the second embodiment of the present invention.
Figure 7B:
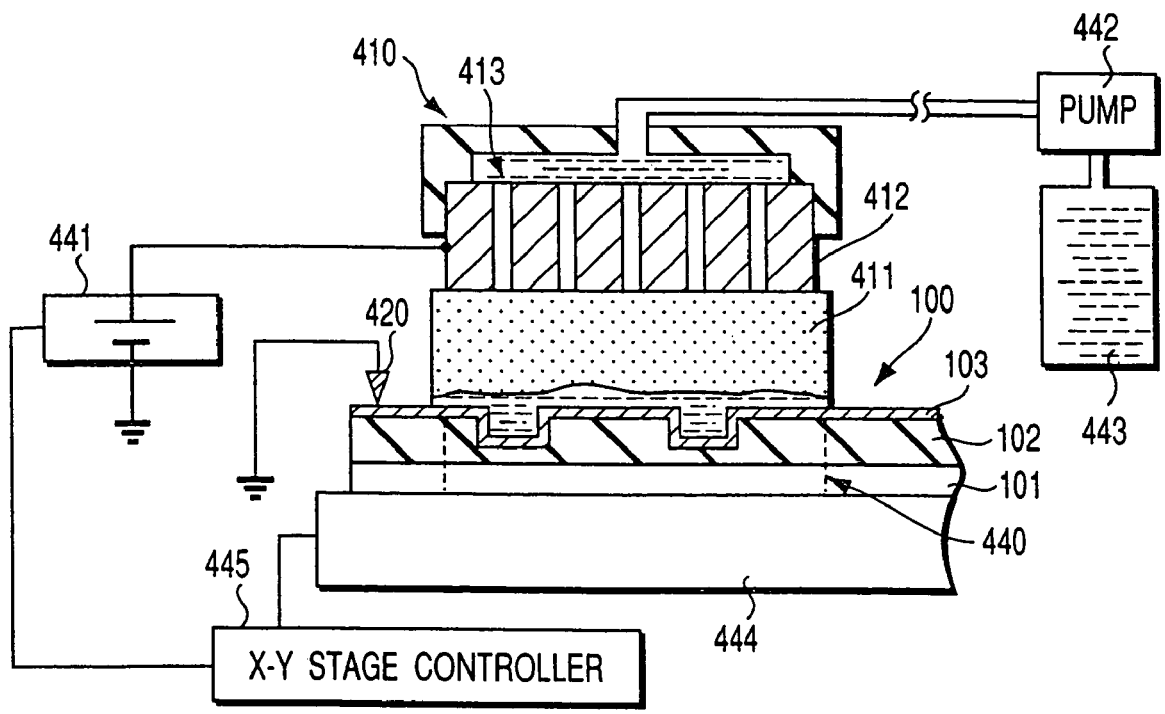
FIG. 7B is a sectional view showing part of a section taken along the line 7B-7B in FIG. 7A.

FIGS. 7A and 7B are views showing the schematic structure of a plating apparatus according to the second embodiment of the present invention. FIG. 7A is a plan view showing the schematic structure of the plating apparatus including a substrate to be processed, and FIG. 7B is a sectional view taken along the line 7B-7B in FIG. 7A.

A plating head 410 is placed on the surface of a substrate 100 to be processed. The plating head 410 is comprised of an impregnated pad (impregnated member) 411 directly placed on the substrate, and an anode 412 which is set on the impregnated pad 411 and connected to a power supply 441. The anode 412 made of a mass of phosphorous containing copper has through holes 413 having a diameter of 0.5 mm. A plating solution in a plating solution tank 443 is properly supplied to the impregnated pad 411 through the through holes 413 by a pump 442. The through holes 413 formed in the anode 412 are very effective in order to remove bubbles generated by various causes in plating. Note that the anode 412 can be made of a copper wire mesh to attain the same effects as those of the anode having holes. The mesh is formed by knitting a 0.2-mm φ copper wire into a net. Alternatively, an anode formed by adding platinum to a porous metal material or porous carbon may be employed.

Eight needle-like cathode contacts 420 are set outside the region of a chip pattern 440 on the substrate 100. The conductive layer 103 of the substrate 100 is electrically connected to the cathode contacts 420.

The substrate 100 is placed on an X-Y stage 444. In forming a plating film, movement of the X-Y stage 444 is controlled by an X-Y stage controller 445 to scan the surface of the conductive layer 103 of the substrate 100 with the impregnated pad 411. In the second embodiment, the conductive layer 103 was repetitively scanned at a scanning rate of 100 mm/s.

The X-Y stage controller 445 is connected to the power supply 441, and receives a plating current only when the plating head exists in the region of the chip pattern 440, so as not to form any plating film outside the region of the chip pattern 440.

The plating solution is appropriately supplied through the through holes 413 formed in the anode 412 during scanning to replenish the impregnated pad 411 with the plating solution so as not to run out the plating solution in the impregnated pad 411. If some of the through holes 413 are used as plating solution circulating strainers, a fresh plating solution can be supplied by circulating the plating solution.

In scanning the plating film formation region with one stroke, the impregnated member may be slid while a current is kept supplied.

When a copper plating film is formed using the above apparatus, the impregnated pad 411 rubs a copper plating film 406 formed on an upper surface 105 of the substrate by relative movement of the impregnated pad 411 and Si substrate, as shown in FIG. 8. Hence, almost no thin film is formed from the plating solution additive on the upper surface 105, and the additive acts in only a depression 104.

If a soluble copper complex compound (generally called a carrier) such as disulfide [HSO$_3$—R—S=S—R—SO$_3$H] is added as an additive, the formation rate of the plating film increases on the surface where the additive exists. As a result, film formation in a depression such as a groove or hole preferentially occurs. Also in the first embodiment, the plating rate is different between the upper surface of the substrate and the depression. This difference further widens in the second embodiment.

Figure 9A:
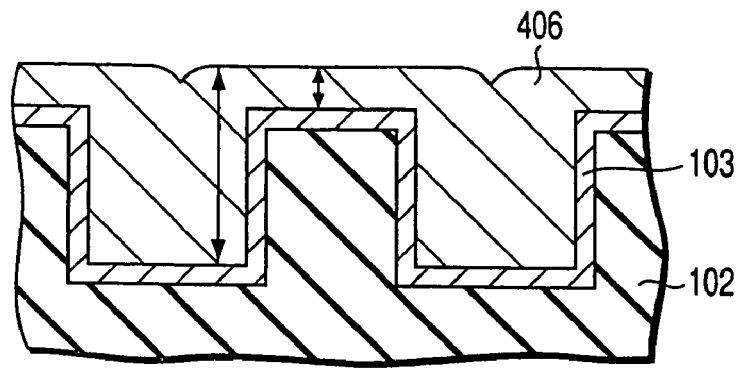
FIG. 9A is a sectional view showing a plating film formed in the second embodiment.
Figure 9B:
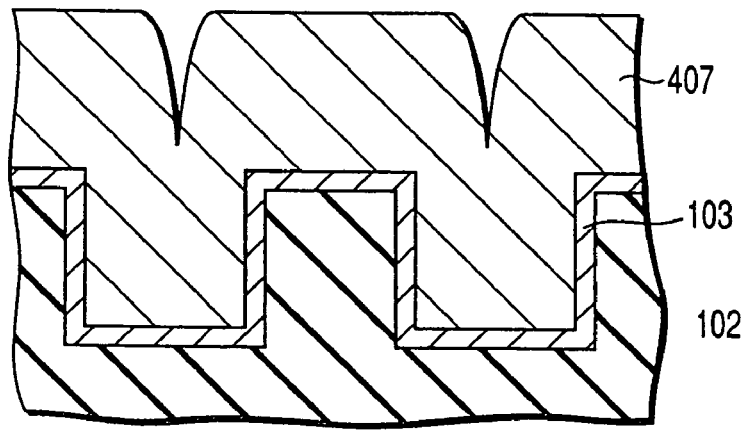
FIG. 9B is a sectional view showing a conventional plating film.

The copper plating film 406 formed by the apparatus becomes very smooth, as shown in FIG. 9A. The film can be smoothened more easily than a copper plating film 407 (FIG. 9B) formed by the above-described cup method.

Figure 10:
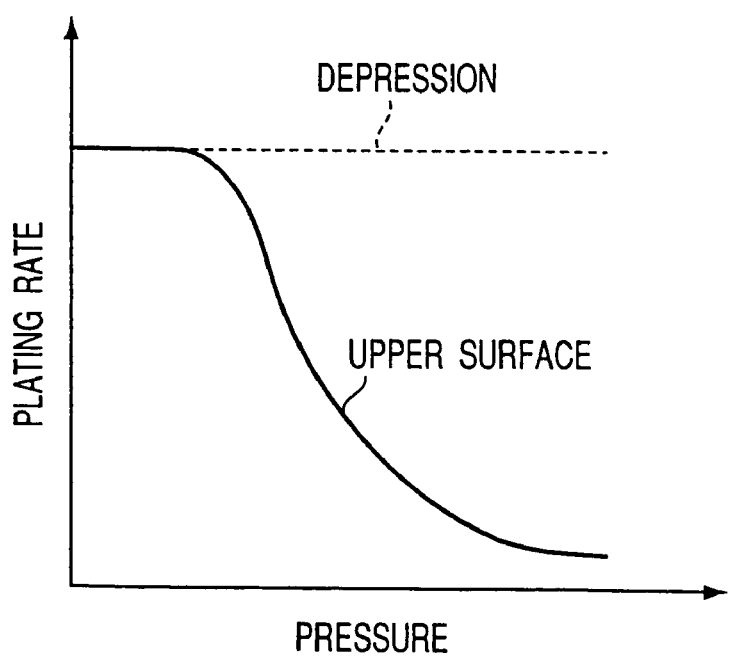
FIG. 10 is a graph showing the dependency of plating rate on pressures applied to the impregnated pad, comparing that of a plating film formed on a surface of a substrate to be processed and that of a plating film formed in a depression of the surface.

Note that the plating rate of the copper plating film on the upper surface of the substrate changes depending on the pressure applied to the impregnated pad. The pressure dependency of the plating rate of the copper plating film is shown in FIG. 10. As is apparent from FIG. 10, the depression and the upper surface of the substrate have almost no difference in the plating rate of the copper plating film for a low pressure. As the pressure increases, the plating rate on the upper surface of the substrate decreases.

Figure 26:
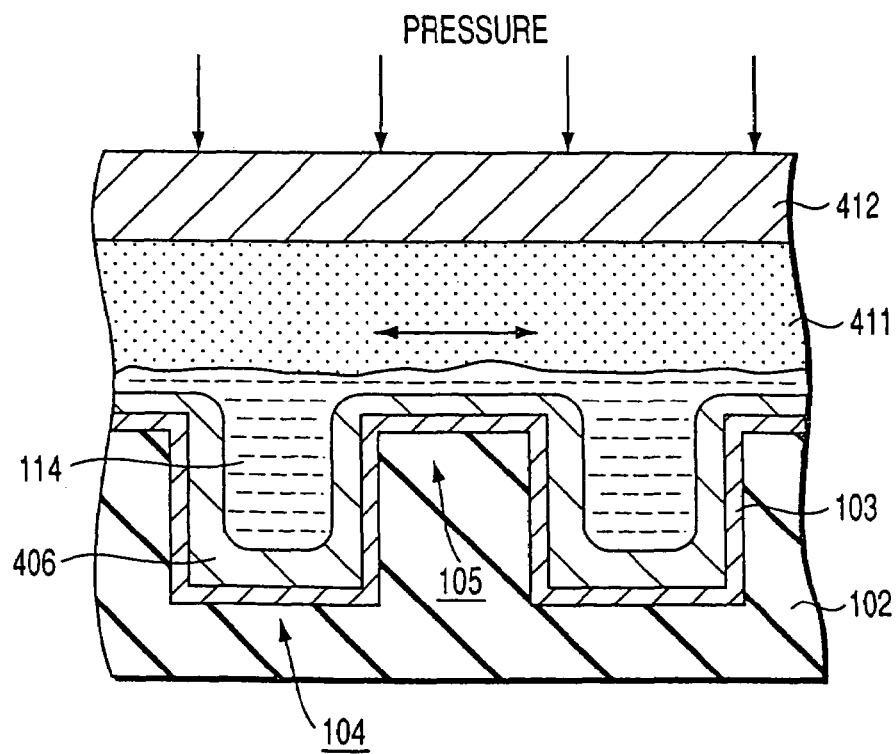
FIG. 26 is a schematic sectional view around a plated portion in a case where the impregnated pad is apart from the conductive layer in the second embodiment.

In the above-described embodiments, the impregnated pad 411 was in contact with the conductive layer 103 or plating film 406 as shown in FIG. 8. However, the impregnated pad 411 may be set so as to be apart from the conductive layer 103 or the plating film 406, that is, to face the conductive layer, as shown in FIG. 26. With this arrangement, a dynamic pressure is generated in the plating solution due to relative movement. A pressure difference between an inside and an outside of the depression 104 caused by the dynamic pressure can make the plating rate greater in a groove or a hole than that on the upper surface of the substrate.

The copper plating film formed using this apparatus is formed on only the chip pattern surface. No film is formed at a portion except for the chip, which is effective for cleaning and the like. For example, since no copper plating film is formed at the edge of the substrate, contamination of the apparatus in the next step can be easily avoided.

Defects of the plating film caused by bubbles and dust in the plating solution are greatly reduced. This is because bubbles are removed from holes formed in the anode, and the impregnated pad moves on the substrate to prevent bubbles and dust from staying at one portion.

Third Embodiment

Figure 11A:
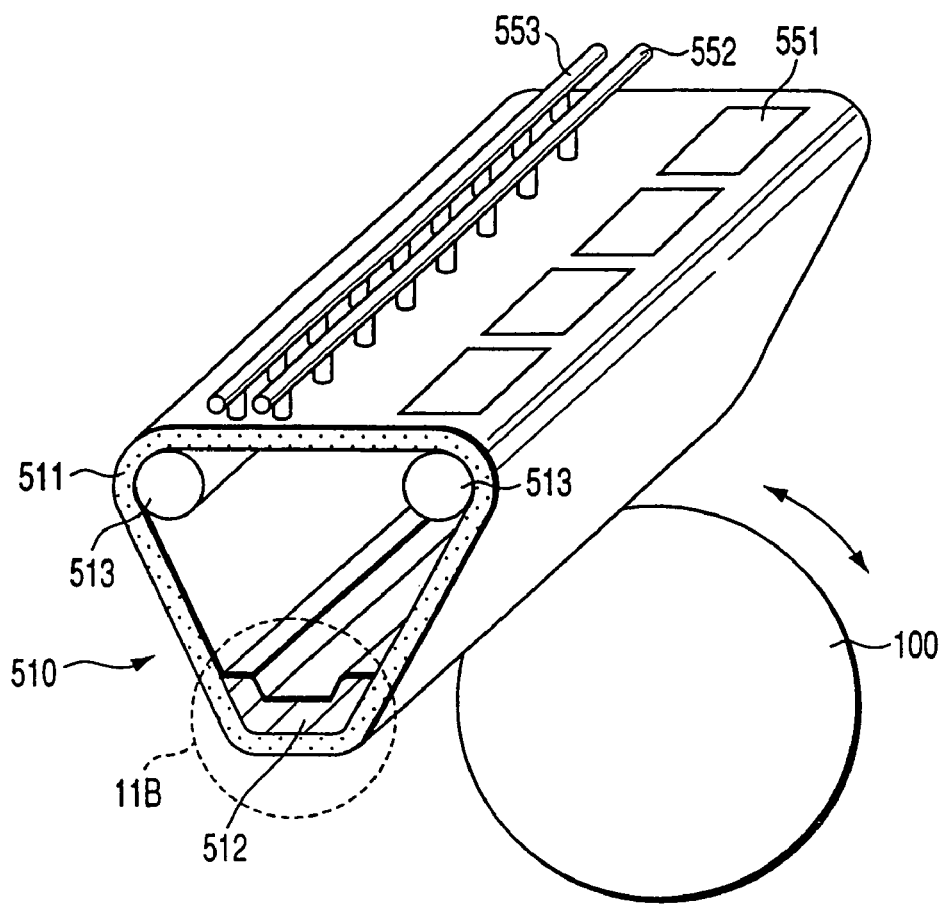
Figure 11B:
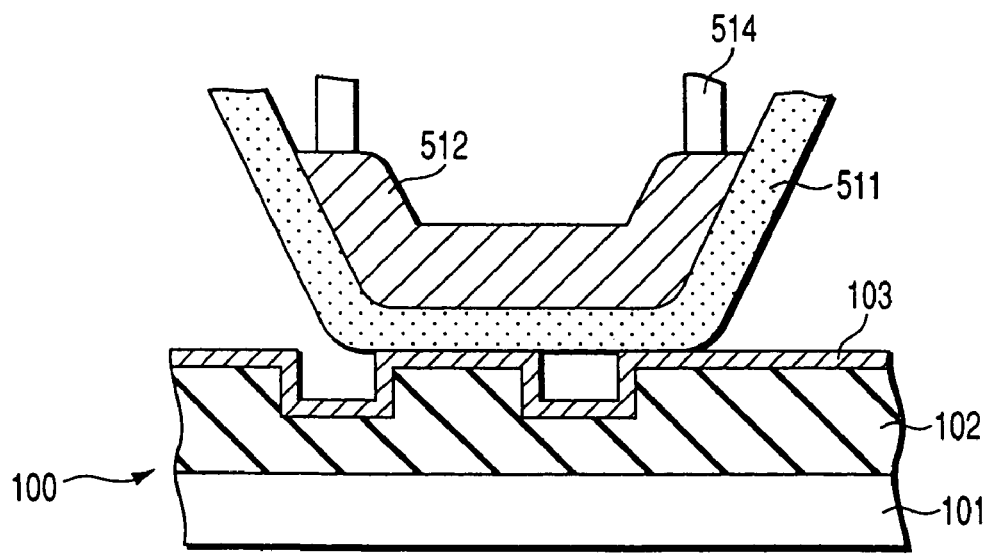
Figure 12:
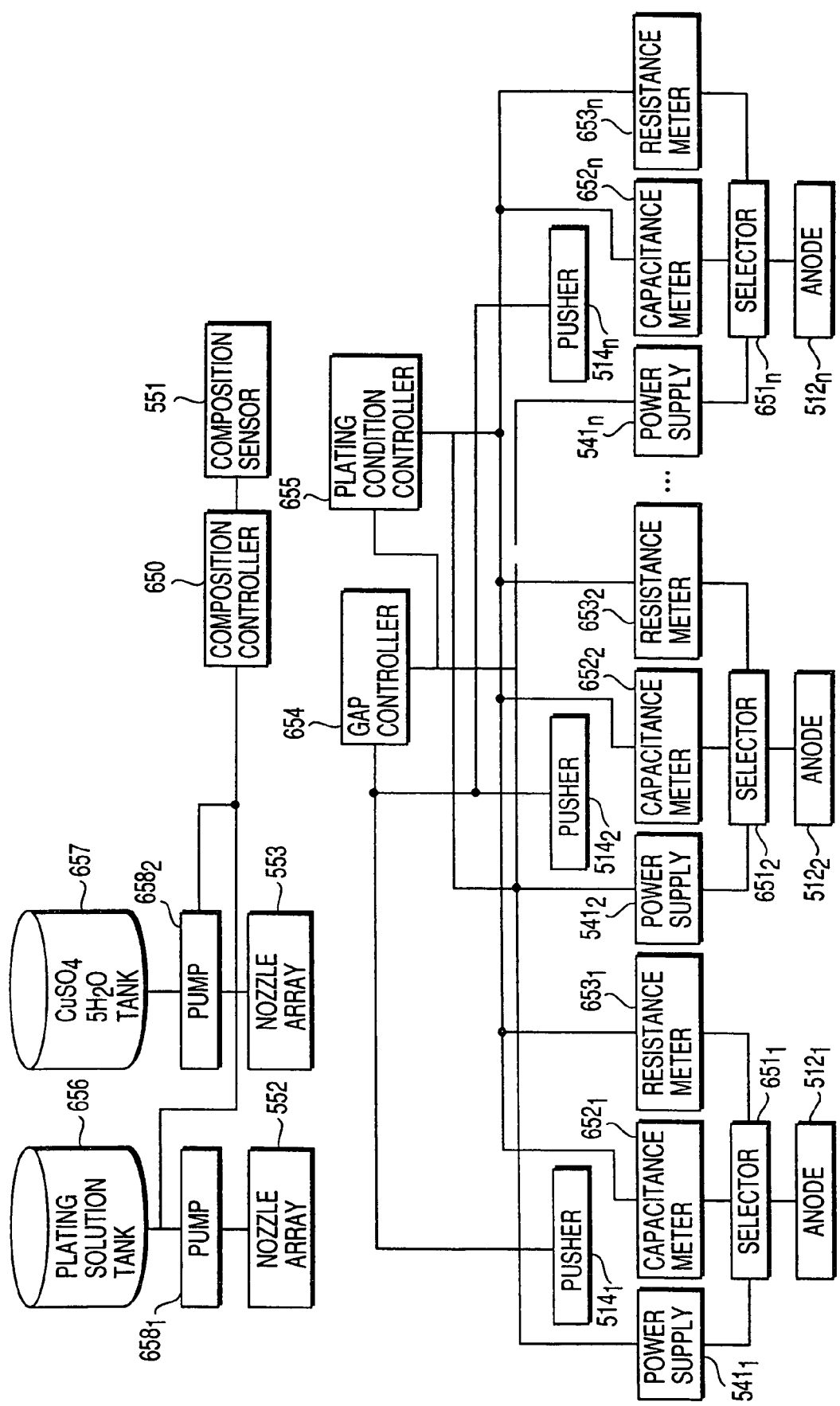
FIG. 12 is a block diagram showing the schematic arrangement of the plating apparatus according to the third embodiment of the present invention.

FIGS. 11A and 11B are views showing the schematic structure of a plating apparatus according to the third embodiment of the present invention. FIG. 12 is a block diagram showing the schematic arrangement of the plating apparatus according to this embodiment.

As shown in FIG. 11A, the impregnated member of a plating head according to the third embodiment is formed from a band-like impregnated cloth 511 connected like an endless loop. An anode 512 and two rollers 513 are attached to the inner surface of the band-like impregnated cloth 511, and the endless-looped impregnated cloth 511 has a trapezoidal shape.

As shown in FIG. 12, the anode 512 is made up of a plurality of anodes $512_1$ to $512_n$ respectively connected to power supplies $541_1$ to $541_n$ via selectors $651_1$ to $651_n$. In the third embodiment, platinum is used as an anode material. Platinum has a long service life because it does not dissolve in copper plating solution. Note that copper ions in a plating solution decrease with a plating current.

The anodes $512_1$ to $512_n$ are respectively connected to capacitance meters $652_1$ to $652_n$ and resistance meters $653_1$ to $653_n$ via the selectors $651_1$ to $651_n$. Each capacitance meter 652 and resistance meter 653 measure the electrostatic capacitance and resistance between the anode 512 and a substrate 100 to be processed. Based on the measurement results, a gap controller 654 obtains the gap between the anode 512 and the surface of the substrate 100, and controls pushers $514_1$ to $514_n$ to control the gap between the substrate 100 and anode 512. The parallelism between the anode and substrate and the absolute value of the distance between the anode and substrate, which are important in the present invention, can be managed by measuring and adjusting gaps at a plurality of portions.

Each power supply 541 is connected to a plating condition controller 655. The plating condition controller 655 makes the thickness of the plating film uniform by controlling a plating current value supplied to each anode 512 in accordance with the position of the substrate. The plating condition controller 655 is connected to each capacitance meter 652 and resistance meter 653, and controls a plating current value supplied to a corresponding anode 512 in accordance with the measurement results of the meters 652 and 653.

A plating solution composition sensor 551 formed from a pH sensor is set on the trapezoidal impregnated cloth 511, and measures the pH of the plating solution contained in the impregnated cloth 511 to obtain the composition of the solution. The composition sensor 551 may obtain the composition of the plating solution by using an ammeter in addition to the pH sensor and measuring the conductance of the plating solution contained in the impregnated cloth 511. Instead, the composition sensor 551 may use an optical sensor which utilizes light absorption of the solution.

In accordance with the measurement results of the composition sensor 551, a composition controller 650 controls pumps $658_1$ and $658_2$ respectively connected to a plating solution tank 656 and $CuSO_4.5H_2O$ tank 657. Accordingly, the composition controller 650 controls the amounts of plating solution and $CuSO_4.5H_2O$ supplied to the impregnated cloth 511 from a plating solution supply nozzle array 552 and $CuSO_4.5H_2O$ supply nozzle array 553, and adjusts the composition of the plating solution contained in the impregnated cloth 511.

The plating solution is appropriately supplied from the nozzle array 552 to the impregnated cloth 511. As described above, the third embodiment uses a platinum electrode for an anode, so that copper ions in the plating solution decrease with the progress of plating. This becomes conspicuous particularly in the use of a thin sheet-like impregnated member. This solution composition adjusting mechanism is therefore very effective for improving stabilization of plating conditions. When a thin band-like impregnated cloth connected like an endless loop is adopted as in the third embodiment, the composition of the plating solution can be easily adjusted at a place apart from the plated surface.

Figure 13:
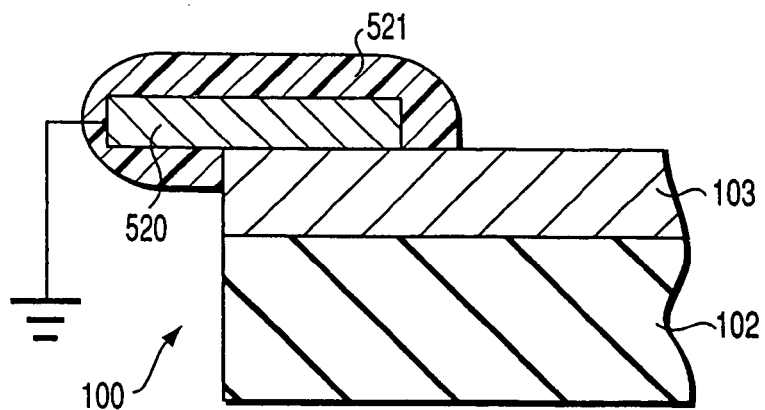
FIG. 13 is a sectional view showing the connected portion between the cathode contact of the plating apparatus and a conductive layer in the third embodiment.

As shown in FIG. 13, a cathode contact 520 electrically connected to the conductive layer 103 of the substrate 100 is laid down at the outermost periphery of the substrate 100, and fixed by a resin 521. Since the cathode contact 520 is fixed by the resin, even if plating head 510 rides on the cathode contact 520, the impregnated cloth 511 and cathode contact 520 do not directly contact each other, and the cathode contact 520 is not disconnected from the conductive layer 103.

In order to form a plating film with a uniform film thickness using this apparatus, attention must be paid to the fact that the effective area of a substrate to be plated changes with movement of the substrate. For this reason, the plating current supplied to the anode is controlled in accordance with a change in area.

Figure 14A:
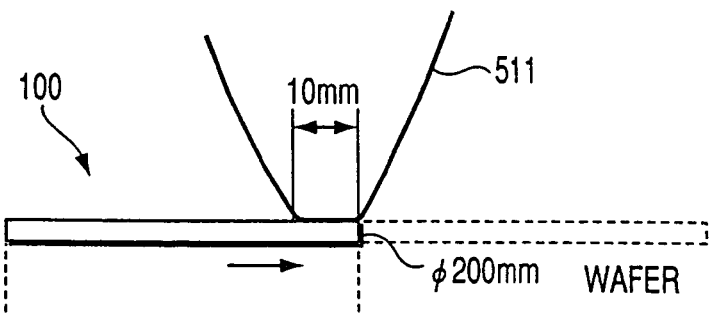
FIG. 14A is a conceptual view for explaining a plating method of scanning a substrate to be processed with an impregnated cloth.
Figure 14B:
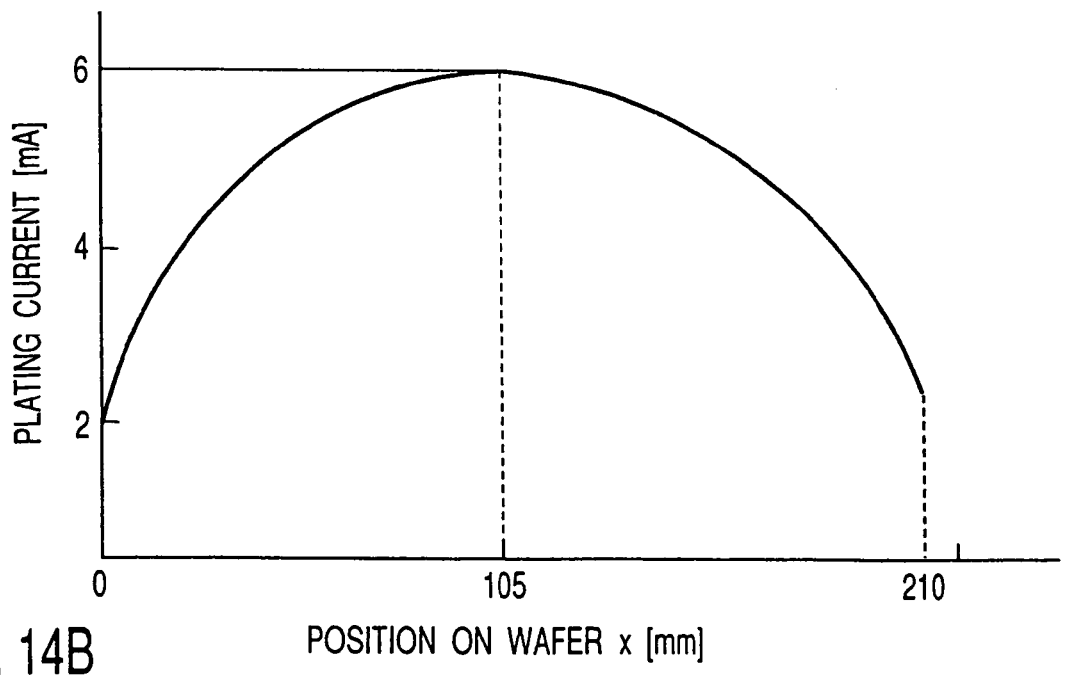
FIG. 14B is a graph showing the positional dependency of a plating current value on the substrate according to the plating method in FIG. 14A.

For example, assume that the diameter of the substrate 100 is 200 mm, and the contact width between the substrate 100 and impregnated cloth 511 in a direction parallel to the scanning direction is 10 mm, as shown in FIG. 14A. As the conditions of the plating current supplied to the anode, an optimum current value obtained in advance from the position of a substrate which reciprocates at a constant speed may be used, as shown in FIG. 14B. The area may be calculated from the capacitance or resistance to sequentially perform plating at a constant current density. Alternatively, the moving speed of the substrate may be changed to supply a constant amount of electric charges to the entire plated surface.

Figure 15A:
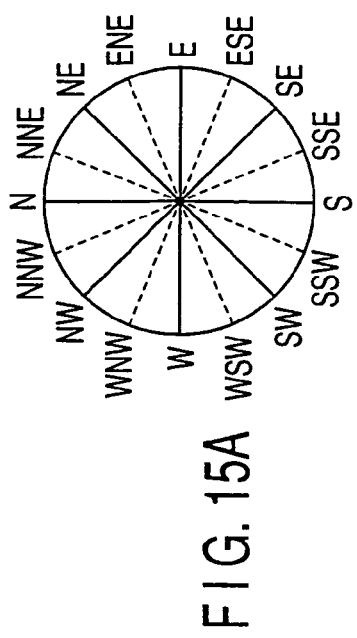
Figure 15C:
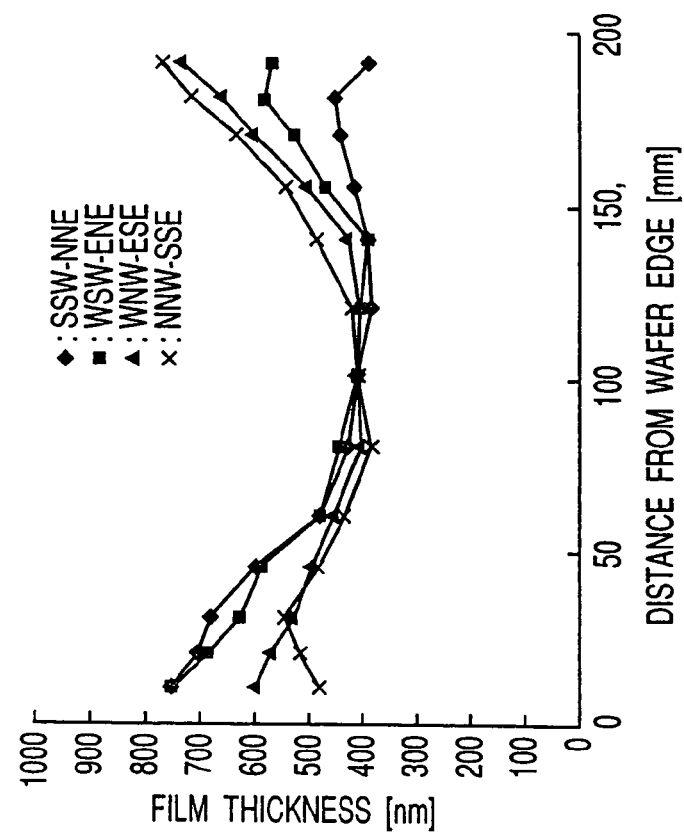
Figure 15B:
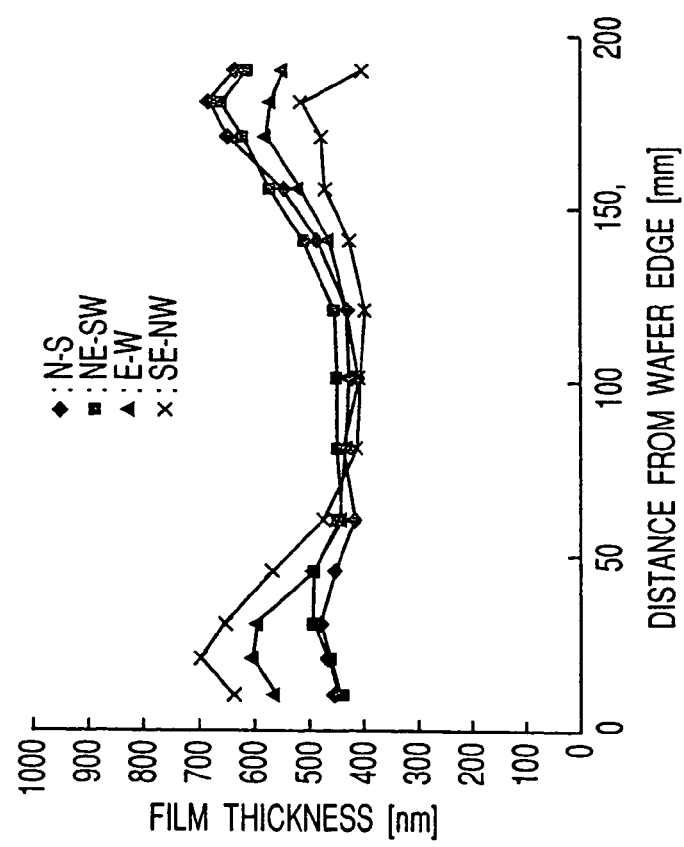

FIGS. 15A to 15C are a view and graphs, respectively, showing the uniformity of a plating film formed at a constant voltage on a substrate to be processed. Cathode contacts are set at eight points NNE, ENE, ESE, SSE, SSW, WSW, WNW, and NNW in FIG. 15A. The diameter of the substrate is 200 mm, the plating current is 20 $mA/cm^2$, and the $CuSO_4$ concentration in the plating solution is 75 g/Liter.

FIG. 15B is a graph showing the uniformity of the plating film by line segments connecting middle points between adjacent cathode contacts, i.e., line segments indicated by solid lines in FIG. 15A. FIG. 15C is a graph showing the uniformity of the plating film by line segments each connecting cathode contacts, i.e., line segments indicated by dotted lines in FIG. 15A.

As is apparent from FIGS. 15B and 15C, the plating film varies depending on the position from the cathode contact. The power supply controller changes a voltage applied to the anode in accordance with the detection results of a position sensor (not shown), and controls the plated thickness uniform on the substrate surface. This control is done by measuring the in-plane plated thickness distribution after a plating film is formed on a substrate at a constant voltage in advance, and calculating from the measurement results a voltage distribution which provides a uniform film thickness.

In the third embodiment, film plating with a uniform film thickness is performed on the substrate surface. In some cases, however, the film thickness at the periphery of the substrate may be wanted to be made small or large for post-process convenience. Also in such case, a desired film thickness distribution can be attained by properly changing a current/voltage applied to each anode or the moving speed of the substrate.

A cleaning head, field etching head, and CMP head having similar mechanisms to that of the apparatus can be adopted to realize an apparatus capable of performing parallel processes.

Further, a plated-thickness meter using, e.g., an eddy current generated by electromagnetic induction is installed as a film thickness monitor in front of the head. Film formation is executed while the film thickness on the substrate surface is measured on the forward path of the plating head which reciprocates, and the plating current, the moving speed of the substrate, and other plating conditions are controlled on the return path based on the measurement results. This enables precisely managing the final film thickness.

Fourth Embodiment

The fourth embodiment will exemplify a plating method using a smaller plating head than a substrate to be processed.

FIG. 16 is a view showing the schematic structure of a plating apparatus according to the fourth embodiment of the present invention. A 200-mm φ substrate 100 is plated using a 20-mm φ plating head 1010 smaller than the substrate.

The plating head 1010 made up of an impregnated pad 1011 and anode 1012 comprises a moving mechanism (not shown) which can move up and down, right and left, and forward and backward, and a position sensor 1041 for monitoring the moving position. A plated-thickness monitoring sensor 1042 using electromagnetic induction is also set near the head 1010.

Cathode contacts 1020 are set as platinum contacts at six portions on the outermost periphery (about 1 mm on the periphery) in order to avoid any contact scratches because an LSI chip in process is present on the substrate (8-inch wafer) 100 except for its periphery. A 100-nm thick copper film is sputtered on the substrate 100 in advance as a conductive layer for forming a plating film.

To supply a plating solution to the impregnated pad 1011 (or replace an old plating solution with a new one), the plating head 1010 is effectively moved to a plating solution reservoir 1043 by a moving mechanism and swung vertically and horizontally so as to press the head 1010 against the bottom of the plating solution reservoir 1043.

When the cathode contact is set at the outermost periphery of the substrate 100, as described above, the plating rate on the substrate surface changes upon constant-voltage plating because of a thin conductive layer and high resistance. Experimental results revealed that the film thickness decreased about 30% near the center. This trend becomes more typical as the conductive layer material increases in resistance or decreases in thickness.

The voltage varies for a constant plating current, which varies the plating film quality (crystallinity, filling performance, flatness, and the like) on the substrate surface. Thus, plating is executed at a constant voltage while the distance between the anode and the surface of the plating film is controlled to control the current. The plated thickness is measured by the film thickness sensor 1042, and the plating head 1010 is repetitively moved to repeat plating until a target film thickness is attained. Accordingly, a desired film thickness (determined by total electric charges received by a target surface) can be obtained by constant-voltage plating regardless of the distance from the cathode contact 1020.

When the substrate has a groove pattern, the impregnated pad is also effectively swung vertically and horizontally using an ultrasonic oscillator in order to prompt circulation of the plating solution.

Instead of repeating plating with the above plating head until a desired film thickness is obtained, selective plating may be performed by selectively bringing the distal end of a pen-like impregnated pad smaller than the impregnated pad of the head into contact with the conductive layer and moving the impregnated pad in accordance with the film thickness distribution.

Fifth Embodiment

The fifth embodiment proposes the structure of an apparatus in which the distance between the anode and cathode is always kept constant to easily make the plated thickness uniform.

FIG. 17 is a sectional view showing the schematic structure of a plating apparatus according to the fifth embodiment of the present invention. In a plating head 1110 according to the fifth embodiment, an anode 1112 equal in diameter to a pad 1111 is set on the columnar impregnated pad 1111 that contains a plating solution. A dielectric isolation layer 1113 is formed on the impregnated pad 1111 and anode 1112. An impregnated pad 1114 which is almost equal in thickness to the impregnated pad 1111, made of the same material as the pad 1111, and contains an electrolytic solution is formed on the isolation layer 1113. A doughnut-like cathode 1115 equal in inner and outer diameters to the impregnated pad 1114 is set on it. A hydrophobic outer ring layer 1116 is formed on the impregnated pad 1114 and cathode 1115.

As the electrolytic solution contained in the impregnated pad 1114, a 10% aqueous hydrochloric acid solution is used. Hydrochloric acid, which does not corrode a copper plating film, is suitable for forming a copper plating film. Note that the electrolytic solution is not limited to hydrochloric acid, and can be an arbitrary solution so long as it does not corrode the plating film.

According to the structure of the apparatus, the cathode is electrically connected to the substrate through the electrolytic solution contained in the impregnated pad 1114, and the cathode 1115 and anode 1112 are electrically connected through the plating solution, the conductive layer on the substrate surface, and the electrolytic solution. As a result, a plating film is formed on the substrate on which the impregnated pad 1111 is placed on the surface.

According to this apparatus, the anode and cathode move with a distance always kept constant, so that a uniform film can be formed. The same effects can also be attained by the following structure. That is, the plating solution-impregnated pad and anode are replaced with the electrolytic solution-impregnated pad and cathode. The electrolytic solution-impregnated pad and cathode are formed into a columnar shape, and the plating solution-impregnated pad and anode are formed into a doughnut shape.

Sixth Embodiment

The sixth embodiment will exemplify a technique of forming a bump on a semiconductor chip or the like using the above-described impregnation method.

A method of performing bump processing for a semiconductor chip includes a method of electroplating a substrate in a plating bath using a photoresist or the like as a mask, and a method of press-fixing a ball to a substrate. The plated thickness generally used in a bump is about 100 times that in the LSI thin film process, i.e., in the order of 100 μm. Therefore, film plating is not negligible with respect to the thickness (generally, several μm to several ten mm) of the impregnated cloth. Moreover, different attention from the above-mentioned embodiments must be paid in terms of sufficient supply of a plating solution to the distal end of the impregnation head.

The sixth embodiment concerns a simple high-precision bump plating technique using impregnation plating. The characteristic feature of this embodiment is to form a thick film with the distal end of a fine impregnated cloth (only the distal end may be sharpened).

Figure 18:
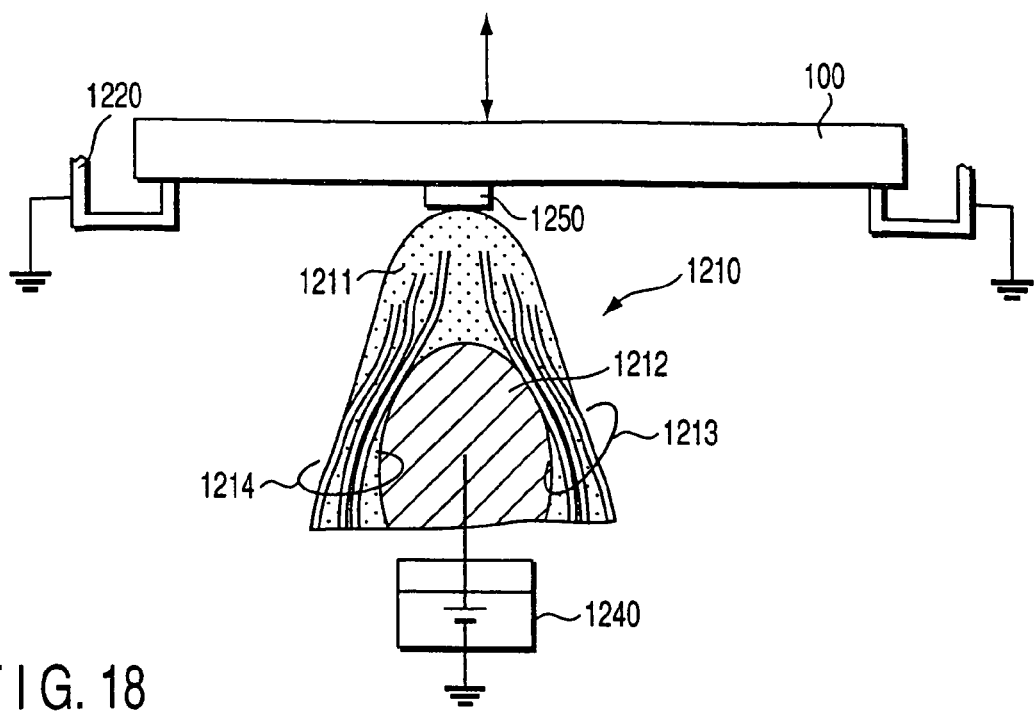
FIG. 18 is a sectional view showing the schematic structure of the main part of a plating apparatus according to the sixth embodiment of the present invention.

FIG. 18 is a sectional view showing the schematic structure of a plating apparatus according to the sixth embodiment of the present invention. An impregnation head 1210 has an impregnated material (impregnated member) 1211 so as to cover a projected anode 1212 connected to a DC pulse power supply 1240. The discharge ports of fine nozzles 1213 for supplying a plating solution, and the suction ports of fine strainers 1214 for discharging the plating solution are arranged near the distal end of the impregnated material 1211.

The plating solution supplied from each nozzle 1213 to the impregnated material 1211 is sucked by each strainer 1214. Accordingly, the composition (metal ion concentration or additive concentration) of the plating solution at the distal end of the impregnated material 1211 is always kept constant.

If the nozzles 1213 and strainers 1214 are uniformly arranged, the plating solution discharged from each nozzle 1213 is immediately sucked by a corresponding strainer 1214, failing to satisfactorily supply the plating solution to the distal end of the impregnated material 1211. To prevent this, the nozzles 1213 and strainers 1214 are preferably locally arranged to satisfactorily supply the plating solution to the distal end of the impregnated material 1211.

Figure 19A:
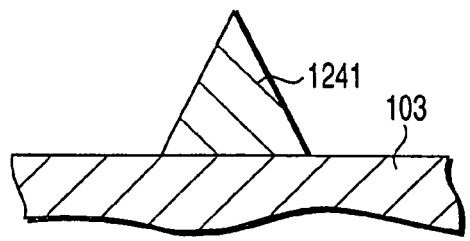
FIGS. 19A to 19D are sectional views each showing a plating bump formed by the plating apparatus according to the sixth embodiment.
Figure 19B:
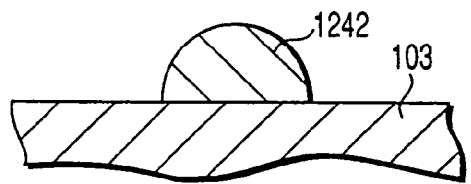
Figure 19C:
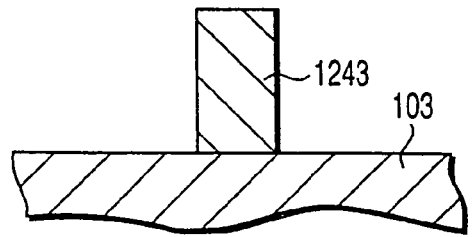
Figure 19D:
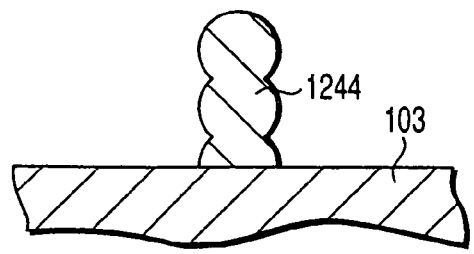

In forming a bump, the impregnation head 1210 is retracted by a moving mechanism (not shown) along with plating of a plating film 1250. By changing the moving speed of the impregnation head 1210 or horizontally moving it, bumps of various shapes can be formed. For example, a conical bump 1241 (FIG. 19A), hemispherical bump 1242 (FIG. 19B), columnar bump 1243 (FIG. 19C), and bump 1244 (FIG. 19D) having a shape of stacked balls can be formed.

Seventh Embodiment

The seventh embodiment relates to a plating apparatus for intentionally forming a plated thickness distribution (profile) corresponding to a pattern on a substrate to be processed or a pattern within a chip.

FIG. 20 is a sectional view showing the schematic structure of a plating apparatus according to the seventh embodiment of the present invention. Note that FIG. 20 shows only an impregnation head, and no substrate, cathode contact, plating bath, and the like are illustrated.

Depressions corresponding to a pattern within a chip are formed on the surface of an impregnated pad 1311 of a plating head 1310. An anode 1312 is connected to the impregnated pad 1311.

For example, in a hybrid system LSI of a DRAM and logic, the DRAM part and logic part are greatly different in pattern density and size even within the same chip. An optimal formation thickness for a subsequent step such as CMP changes depending on the location. Thus, for example, one of the DRAM and logic parts is formed in the depression of the substrate, and a projection corresponding to the depression of the substrate is formed on the surface of the impregnated pad. The projection and side surface of the impregnated pad 1311 can be transformed by heat treatment or filler processing to pores, thereby preventing the plating solution from oozing out from the surface of the impregnated pad 1311. It is also possible to form projections into small dots in the order of several μm and change the density distribution thereof between the DRAM and logic parts.

Note that the technique of the seventh embodiment can be applied to steps formed by the pattern density, pattern shape, size, and difference in height.

A method of forming such an impregnated pad will be explained with reference to FIGS. 21A to 21D.

As shown in FIG. 21A, a rectangular prism-like impregnated pad 1311 and heated mold 1340 are prepared. As shown in FIG. 21B, the impregnated pad 1311 is pressed against the mold 1340 to deform the pad 1311. At the same time, the surface of the impregnated pad 1311 in contact with the mold 1340 is dissolved to transform the surface so as to prevent a liquid from oozing out.

As shown in FIG. 21C, the pad 1311 is extracted from the mold 1340. As shown in FIG. 21D, the lower portion of the impregnated pad 1311 is removed to form a region from which a liquid oozes out.

As shown in FIGS. 22A and 22B, the projection of a heated mold 1342 may be pressed against part of the surface of a pad 1341 (FIG. 22A) to transform part of the surface of the pad 1341 (FIG. 22B). The pad formed by this formation method has the same effects as those of the pad shown in FIG. 20 because supply of the plating solution to the substrate changes between the location against which the mold is pressed and the location against which the mold is not pressed.

The in-plane plated thickness can also be changed by arranging inside an impregnated pad 1351 a plurality of anodes 1352 corresponding to the steps of the substrate surface, and changing potentials applied to the respective anodes 1352, as shown in FIG. 23.

The in-plane plated thickness can also be changed by uniformly forming an anode 1362 on the surface of an impregnated pad 1361, and forming intermediate electrodes 1363 in the pad 1361 so as to apply a field corresponding to the steps of the substrate surface, as shown in FIG. 24. This is because plating conditions such as the ion concentration and field distribution near each intermediate electrode 1363 change depending on the potential applied to the intermediate electrode 1363. Similarly, an insulator can be used in place of the intermediate electrode 1363.

Eight Embodiment

The eighth embodiment will exemplify an apparatus in which a plurality of impregnated pads are attached to an impregnation head and play different roles.

Figure 25:
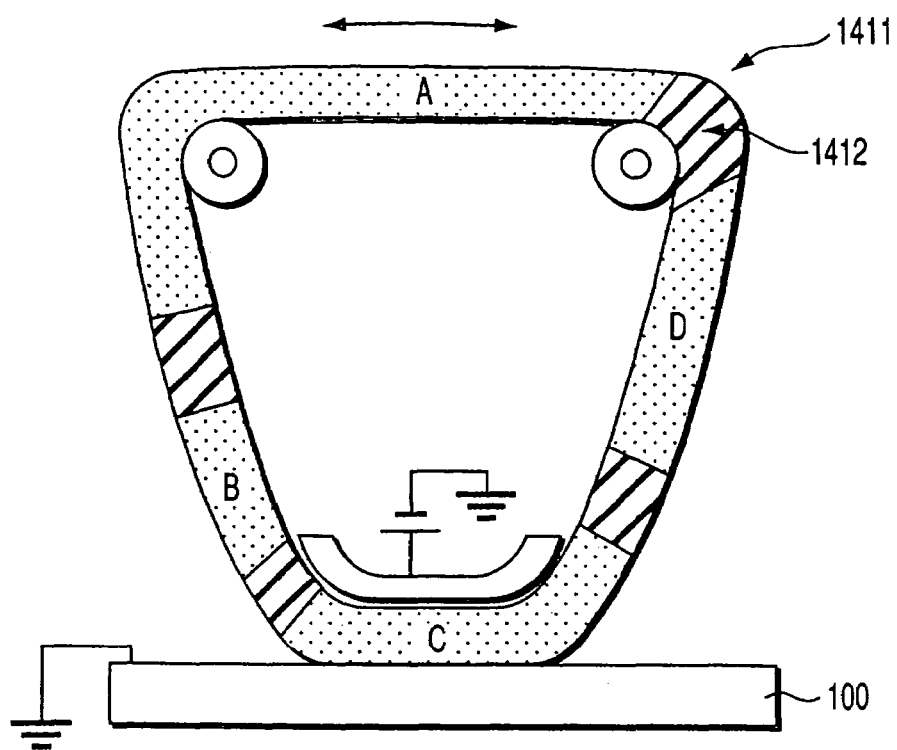
FIG. 25 is a sectional view showing the schematic structure of the main part of a plating apparatus according to the eighth embodiment of the present invention.

FIG. 25 is a view showing the schematic structure of a plating apparatus according to the eighth embodiment of the present invention. The apparatus of this embodiment comprises an endless-looped impregnated belt 1411 obtained by connecting four impregnated cloths A, B, C, and D through isolation regions 1412 including a repellent, spaces, non-impregnated material. The impregnated cloths A, B, C, and D contain different liquids and have different functions. The impregnated cloths A, B, C, and D act on a substrate 100 to be processed by rotating the impregnated belt and bringing an arbitrary impregnated cloth into contact with the substrate 100.

The functions of the impregnated cloths A, B, C, and D include electroplating, electroless plating, electrolytic etching, physical scratching, chemical treatment, chemical mechanical polishing, and pure water cleaning. Different plating solutions may be contained in the respective impregnated cloths.

Note that the present invention is not limited to the above embodiments. A copper film has been exemplified as a plating film to be formed. However, a material other than copper may be formed into a plating film.

The layout of the substrate and impregnated member is not limited to the above embodiments. The impregnated member may be brought into contact with the conductive layer while the substrate and impregnated member are inclined, or the substrate may be placed on the impregnated member.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plating method comprising:
    preparing a substrate to be processed which has a base plate and a conductive layer formed on at least part of the base plate;
    preparing a plating head comprising an anode, an impregnated member in electrical contact with the anode, and a film thickness measuring mechanism provided near the plating head;
    moving the plating head to a plating bath containing a plating solution to dip the impregnated member into the plating bath;
    applying a potential of a cathode to the conductive layer;
    forming a plating film on at least part of the conductive layer by applying an anode potential to the anode and causing the impregnated member containing the plating solution to face the conductive layer; and
    measuring a film thickness of the plating film using the film thickness measuring mechanism,
    wherein forming the plating film includes forming the plating film, on the basis of a measurement result of the film thickness measuring mechanism, while alternately repeating an operation of causing the conductive layer and the impregnated member to face each other and an operation of moving the impregnated member to the plating bath to dip the impregnated member into the plating bath in order to establish a target film thickness.

2. A plating method comprising:
    preparing a substrate to be processed which has a base plate and a conductive layer formed on at least part of the base plate;
    preparing a plating head, prior to contact with the substrate, comprising an anode, a first impregnated member, a cathode, and a second impregnated member, wherein the anode is provided on the first impregnated member, the cathode is provided on the second impregnated member, and the second impregnated member is adjacent to and insulatively spaced apart from the first impregnated member;
    causing the first impregnated member to contain a plating solution and to be in electrical contact with the anode;
    causing the second impregnated member to contain an electrolytic solution different from the plating solution and to be in electrical contact with the cathode;
    connecting the cathode to the conductive layer by causing the second impregnated member to face the conductive layer in a different region from a region where the first impregnated member comes into contact with the conductive layer.

3. The method according to claim 2, wherein the conductive layer is in contact with at least one of the first impregnated member and the second impregnated member.

4. The method according to claim 2, wherein the second impregnated member performs the same sliding movement as the first impregnated member.

5. A plating method comprising the steps of:
    preparing a substrate to be processed which has a base plate and a conductive layer formed on at least part of the base plate;
    preparing a plating head, prior to contact with the substrate, comprising an anode, a first impregnated member, a cathode, and a second impregnated member, wherein the anode is provided on the first impregnated member, the cathode is provided on the second impregnated member, and the second impregnated member is adjacent to and insulatively spaced apart from the first impregnated member, and a film thickness measuring mechanism is provided near the printing head;
    causing the first impregnated member to contain a plating solution and to be in electrical contact with the anode;
    causing the second impregnated member to contain an electrolytic solution different from the plating solution and to be in electrical contact with the cathode;
    connecting the cathode to the conductive layer to face the conductive layer in another region than a region where the first impregnated member faces the conductive layer;
    forming a plating film on at least part of the conductive layer by applying an anode potential to the anode and causing the first impregnated member containing the plating solution to face the conductive layer; and
    measuring a film thickness of the plating film by a film thickness measuring mechanism arranged on the conductive layer in still another region than the regions where the first impregnated member and the second impregnated member face the conductive layer.

6. The method according to claim 5, further comprising forming an additional plating film by causing the first impregnated member and the second impregnated member to face the conductive layer in accordance with a measurement result of the film thickness measuring mechanism.

7. The method according to claim 5, wherein the film thickness measuring mechanism performs the same horizontal movement as the first impregnated member and the second impregnated member.

* * * * *